United States Patent
Shimonishi et al.

(10) Patent No.: US 11,585,862 B2
(45) Date of Patent: Feb. 21, 2023

(54) BATTERY DETERIORATION PREDICTION SYSTEM

(71) Applicant: DENSO CORPORATION, Kariya (JP)

(72) Inventors: Yuta Shimonishi, Kariya (JP); Shuhei Yoshida, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/188,381

(22) Filed: Mar. 1, 2021

(65) Prior Publication Data

US 2021/0270907 A1  Sep. 2, 2021

(30) Foreign Application Priority Data

Feb. 28, 2020 (JP) .............................. JP2020-032713
Dec. 7, 2020 (JP) .............................. JP2020-202930
Jan. 19, 2021 (JP) .............................. JP2021-006549

(51) Int. Cl.
*G01R 31/392* (2019.01)
*G01R 31/367* (2019.01)
*H01M 10/42* (2006.01)

(52) U.S. Cl.
CPC ......... *G01R 31/392* (2019.01); *G01R 31/367* (2019.01); *H01M 10/4285* (2013.01); *H01M 2220/20* (2013.01)

(58) Field of Classification Search
CPC ............... G01R 31/392; G01R 31/367; H01M 10/4285; H01M 2220/20
See application file for complete search history.

(56) References Cited

U.S. PATENT DOCUMENTS

| | | | |
|---|---|---|---|
| 2011/0161025 A1* | 6/2011 | Tomura | H01M 10/486 702/63 |
| 2013/0302688 A1* | 11/2013 | Takezawa | H01M 10/0525 429/231.1 |

(Continued)

FOREIGN PATENT DOCUMENTS

| | | |
|---|---|---|
| JP | 2013-181875 A | 9/2013 |
| JP | 2020-119658 A | 8/2020 |

(Continued)

*Primary Examiner* — Raymond L Nimox
(74) *Attorney, Agent, or Firm* — Oliff PLC

(57) ABSTRACT

In the battery deterioration prediction system, a polarization calculation unit calculates negative and positive electrode polarizations from negative and positive electrode resistances, and an electrical current value flowing through the secondary battery. A CCP calculation unit calculates a negative electrode closed-circuit potential on the secondary battery negative electrode open circuit potential and the negative electrode polarization calculated by the polarization calculation unit, and calculates a positive electrode closed-circuit potential based on the secondary battery positive electrode open circuit potential and the positive electrode polarization calculated by the polarization calculation unit. A capacity prediction unit predicts the positive/negative electrode capacity, and positive/negative electrode SOC deviation capacity of a secondary battery based on at least one of the closed-circuit potential of the negative and positive electrodes calculated by the CCP calculation unit, and predicts the battery capacity based on the negative and positive electrode capacities, and the positive/negative electrode SOC capacity deviation.

12 Claims, 18 Drawing Sheets

(56) References Cited

U.S. PATENT DOCUMENTS

| | | | |
|---|---|---|---|
| 2016/0052419 A1* | 2/2016 | Takahashi | B60L 58/12 |
| | | | 429/61 |
| 2017/0082694 A1* | 3/2017 | Yonemoto | H02J 7/00 |
| 2018/0006335 A1* | 1/2018 | Fujita | H01M 10/446 |
| 2018/0261893 A1* | 9/2018 | Fujita | H02J 7/0021 |
| 2020/0033414 A1 | 1/2020 | Izumi et al. | |
| 2020/0182938 A1* | 6/2020 | Ukumori | H01M 10/42 |

FOREIGN PATENT DOCUMENTS

| | | |
|---|---|---|
| WO | 2019/097357 A1 | 5/2019 |
| WO | 2020/027203 A1 | 2/2020 |

\* cited by examiner

FIRST USAGE HISTORY

SECOND USAGE HISTORY

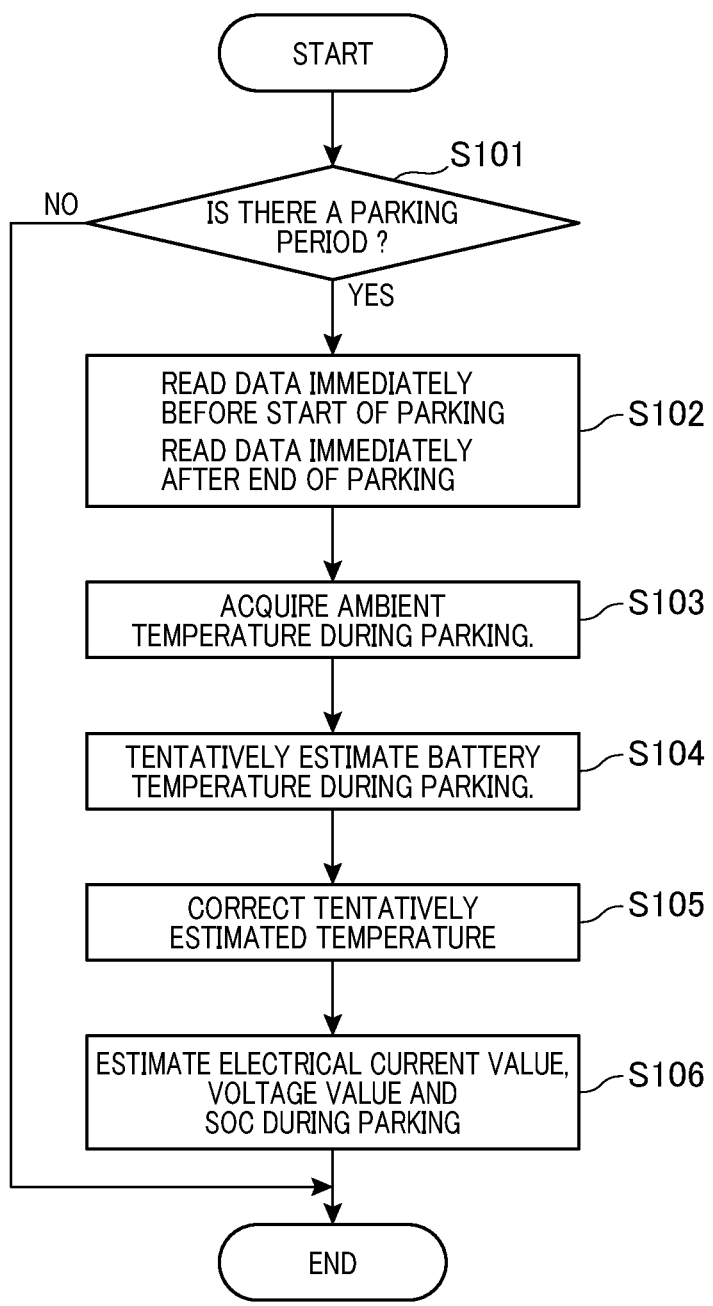

BATTERY DETERIORATION PREDICTION SYSTEM

CROSS-REFERENCE TO RELATED APPLICATION

This application is based on and claims the benefit of priority from earlier Japanese Patent Application No. 2020-032713 filed on Feb. 28, 2020, Japanese Patent Application No. 2020-202930 filed on Dec. 7, 2020, and Japanese Patent Application No. 2021-006549 filed on Jan. 19, 2021, the descriptions of all of which are incorporated herein by reference.

TECHNICAL FIELD

The present invention relates to a battery deterioration prediction system.

BACKGROUND

JP 2013-181875A discloses a system for predicting the degree of deterioration of a secondary battery. The system described in JP 2013-181875A predicts the amount of deterioration of the secondary battery by using a parameter considered to correlate with the amount of impurities adhering to the electrode surface of the secondary battery.

SUMMARY

An aspect of the present invention is a battery deterioration prediction system that includes an electrode resistance acquisition unit that acquires a negative electrode resistance and a positive electrode resistance of a secondary battery, an electrical current value acquisition unit that acquires an electrical current value flowing through the secondary battery, an OCP acquisition unit that acquires an open circuit potential of the negative electrode of the secondary battery and an open circuit potential of the positive electrode of the secondary battery, a polarization calculation unit that calculates a negative electrode polarization and a positive electrode polarization from the negative electrode resistance and the positive electrode resistance acquired by the electrode resistance acquisition unit and the electrical current value flowing through the secondary battery acquired by the electrical current value acquisition unit, a CCP calculation unit that calculates a closed-circuit potential of the negative electrode based on the open circuit potential of the negative electrode acquired by the OCP acquisition unit and the negative electrode polarization calculated by the polarization calculation unit, and calculates a closed-circuit potential of the positive electrode based on the open circuit potential of the positive electrode acquired by the OCP acquisition unit and the positive electrode polarization calculated by the polarization calculation unit, and a capacity prediction unit that predicts the negative electrode capacity, the positive electrode capacity, and the positive/negative electrode SOC capacity deviation of the secondary battery based on at least one of the closed-circuit potential of the negative electrode and the closed-circuit potential of the positive electrode calculated by the CCP calculation unit, and predicts a battery capacity of the secondary battery based on the predicted negative electrode capacity, the positive electrode capacity, and the positive/negative electrode SOC capacity deviation.

BRIEF DESCRIPTION OF THE DRAWINGS

In the accompanying drawings:

FIG. 19 is a flowchart for explaining an estimation process in a data non-acquisition period in a battery deterioration prediction system according to the sixth embodiment.

DETAILED DESCRIPTION OF THE PREFERRED EMBODIMENTS

Figure 1:
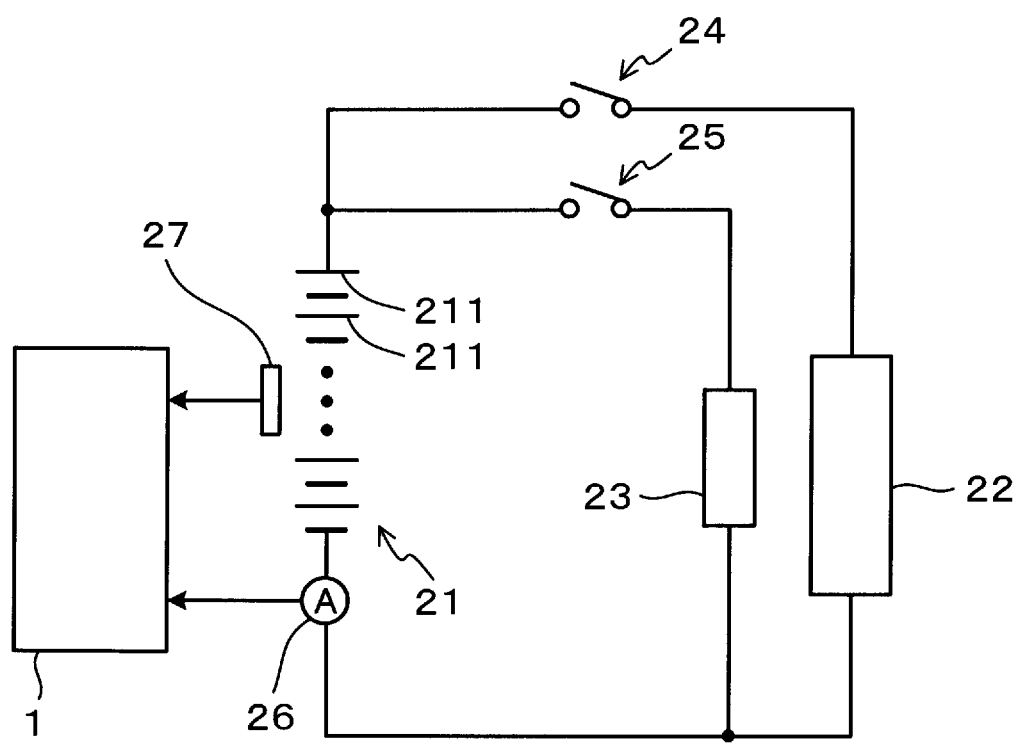
FIG. 1 is a conceptual diagram of a battery deterioration prediction system and a power supply system including the battery deterioration prediction system according to a first embodiment.

For example, in a secondary battery with large current, such as a secondary battery or the like for in-vehicle use, electrode polarization is likely to become apparent. In the system described in JP 2013-181875A, such polarization is not taken into consideration, and it is difficult to improve the accuracy of predicting the deterioration of a secondary battery.

Taking the situation above into consideration, an object of the present invention is to provide a battery deterioration prediction system that is capable of improving the accuracy of predicting the deterioration of a secondary battery.

An aspect of the present invention is a battery deterioration prediction system that includes an electrode resistance acquisition unit that acquires a negative electrode resistance and a positive electrode resistance of a secondary battery, an electrical current value acquisition unit that acquires an electrical current value flowing through the secondary battery, an OCP acquisition unit that acquires an open circuit potential of the negative electrode of the secondary battery and an open circuit potential of the positive electrode of the secondary battery, a polarization calculation unit that calculates a negative electrode polarization and a positive electrode polarization from the negative electrode resistance and the positive electrode resistance acquired by the electrode resistance acquisition unit and the electrical current value flowing through the secondary battery acquired by the electrical current value acquisition unit, a CCP calculation unit that calculates a closed-circuit potential of the negative electrode based on the open circuit potential of the negative electrode acquired by the OCP acquisition unit and the negative electrode polarization calculated by the polarization calculation unit, and calculates a closed-circuit potential of the positive electrode based on the open circuit potential of the positive electrode acquired by the OCP acquisition unit and the positive electrode polarization calculated by the polarization calculation unit, and a capacity prediction unit that predicts the negative electrode capacity, the positive electrode capacity, and the positive/negative electrode SOC capacity deviation of the secondary battery based on at least one of the closed-circuit potential of the negative electrode and the closed-circuit potential of the positive electrode calculated by the CCP calculation unit, and predicts a battery capacity of the secondary battery based on the predicted negative electrode capacity, the positive electrode capacity, and the positive/negative electrode SOC capacity deviation.

The battery deterioration prediction system of the form described above includes a CCP calculation unit that together with calculating a closed-circuit potential of the negative electrode based on an open circuit potential of the negative electrode and the negative electrode polarization, calculates a closed-circuit potential of the positive electrode based on an open circuit potential of the positive electrode and the positive electrode polarization. Then, the capacity prediction unit, together with predicting the negative electrode capacity, the positive electrode capacity, and the positive/negative electrode SOC capacity deviation of the secondary battery based on this closed-circuit potential, also predicts the battery capacity of the secondary battery based on the predicted negative electrode capacity, the positive electrode capacity, and the positive/negative electrode SOC capacity deviation. In this way, by predicting the battery capacity of the secondary battery while considering the polarization of the positive electrode and the polarization of the negative electrode, the battery capacity may be predicted with high accuracy.

As described above, according to this embodiment, it is possible to provide a battery deterioration prediction system capable of predicting the degree of deterioration of a secondary battery with high accuracy.

First Embodiment

An embodiment of a battery deterioration prediction system will be described with reference to FIGS. 1 to 8.

The battery deterioration prediction system 1 of this embodiment is a system that predicts deterioration of the secondary battery 21. In this embodiment, the secondary battery 21 is used by being mounted in a vehicle such as an electric vehicle, a hybrid vehicle, or the like.

As illustrated in FIG. 1, the secondary battery 21 is connected to an inverter 22 and a charging device 23. The inverter 22 converts the DC power supplied from the secondary battery 21 into AC power, and outputs the AC power to a three-phase AC motor (not illustrated).

As illustrated in FIG. 1, the secondary battery 21 includes a plurality of battery cells 211 connected in series with each other. Each individual battery cell 211 includes, for example, a lithium ion secondary battery. The negative electrode of the secondary battery 21 is made of a negative electrode active material such as graphite or the like that is capable of occluding and releasing lithium ions. The positive electrode of the secondary battery 21 may be, for example, a ternary electrode including Ni, Mn, Co such as $LiNi_{1/3}Co_{1/3}Mn_{1/3}O_2$ or the like. Note that the secondary battery 21 may be configured by connecting a plurality of battery cells 211 in parallel to each other to form a cell block, and then connecting a plurality of the cell blocks in series to each other.

As illustrated in FIG. 1, a discharge switch 24 is provided between the secondary battery 21 and the inverter 22. Moreover, a charging switch 25 is provided between the secondary battery 21 and the charging device 23. When supplying power from the secondary battery 21 to the inverter 22, the discharge switch 24 is turned ON, and when charging the secondary battery 21, the charging switch 25 is turned ON. The ON/OFF operation of the charging switch 25 and the discharge switch 24 is controlled by a battery management unit (In other words, a BMU) mounted in the vehicle.

As illustrate in FIG. 1, an electrical current sensor 26 for measuring the electrical current value flowing through the secondary battery 21 is connected to the secondary battery 21. A temperature sensor 27 for measuring the temperature of the secondary battery 21 is arranged in the secondary battery 21. The information of the secondary battery 21 acquired by the electrical current sensor 26 and the temperature sensor 27 is transmitted to the battery deterioration prediction system 1.

Figure 2:
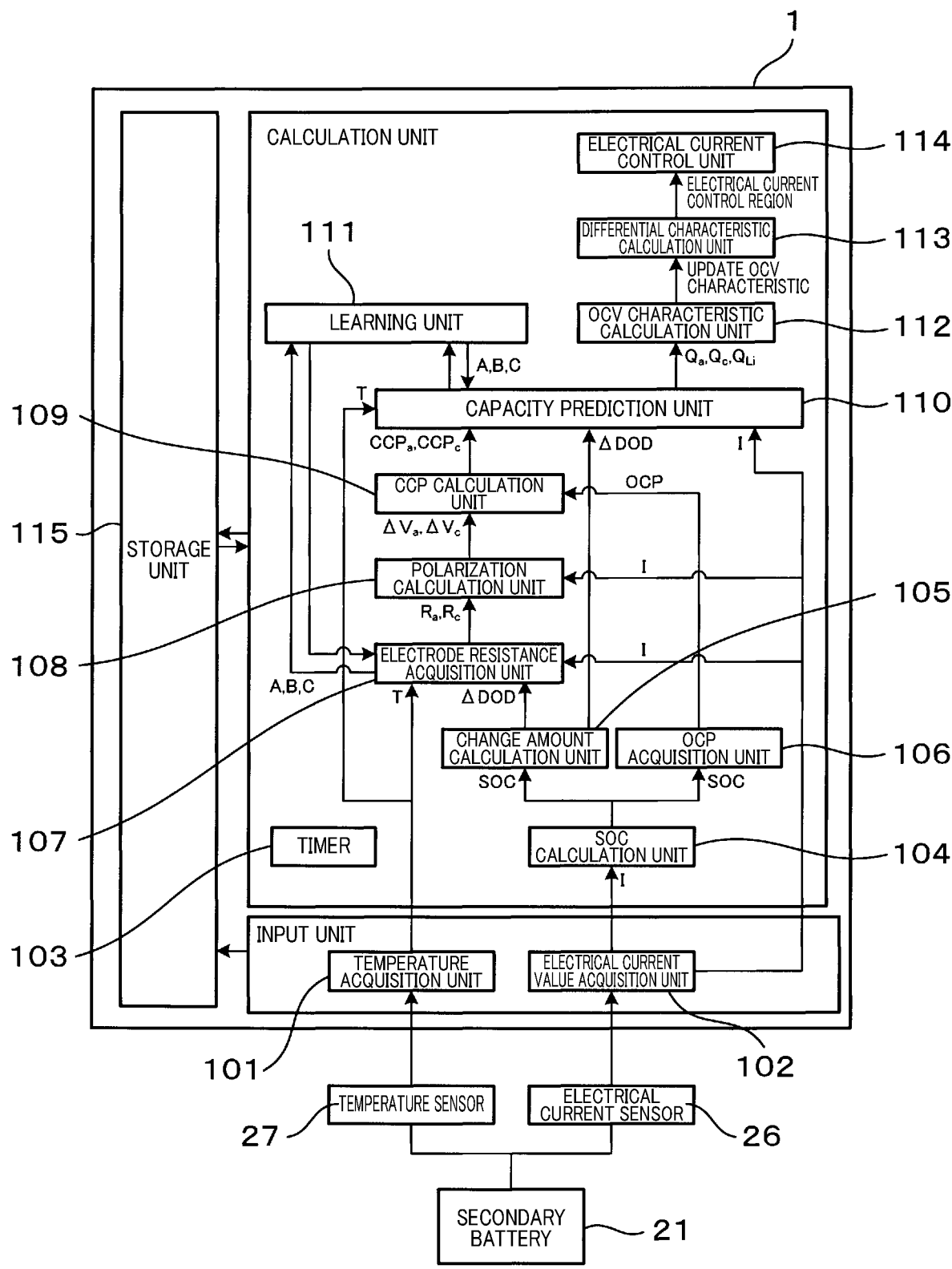
FIG. 2 is a functional block diagram illustrating a configuration of a battery deterioration prediction system according to the first embodiment.

As illustrated in FIG. 2, the battery deterioration prediction system 1 includes a temperature acquisition unit 101, an electrical current value acquisition unit 102, a timer 103, an SOC calculation unit 104, a change amount calculation unit 105, an OCP acquisition unit 106, an electrode resistance acquisition unit 107, a polarization calculation unit 108, a CCP calculation unit 109, a capacity prediction unit 110, a learning unit 111, an OCV characteristic calculation unit 112, a differential characteristic calculation unit 113, and an electrical current control unit 114. These are configured, for example, by a vehicle-mounted BMU. In addition, each of these units includes a volatile storage unit that functions as a calculation area, a non-volatile storage unit that stores various programs, and a processor. In other words, each of these parts is configured to be able to execute a program for performing its own function. Note that at least one of these may be composed of an electronic circuit (in other words, hardware) for performing its own function.

Next, a step in which the battery deterioration prediction system 1 predicts the battery capacity QB will be described with reference to FIGS. 2 and 3.

First, in step S1, the timer 103 acquires the elapsed time t from the start of use of the secondary battery 21, the electrical current value acquisition unit 102 acquires the electrical current value I of the secondary battery 21, and the temperature acquisition unit 101 acquires the temperature T of the secondary battery 21.

The usage time of the secondary battery 21 measured by the timer 103 is sent to the storage unit 115 and stored. The storage unit 115 includes, for example, a rewritable non-volatile memory. The battery deterioration prediction system 1 continuously predicts the battery capacity $Q_B$, where the start time of one prediction operations is $t_s$, the end time is $t_e$, and the time from the start time $t_s$ to the end time $t_e$ is referred to as an execution cycle. If the execution cycle is a short period such as 1 second, for example, the accuracy of the capacity prediction is likely to be improved, but the calculation load will be increased. On the other hand, when an execution cycle is a long period, it is difficult to improve the accuracy of the capacity prediction, but the calculation load will be reduced. The execution cycle may be appropriately determined in consideration of this factor.

The electrical current value acquisition unit 102 periodically receives the electrical current value information of the secondary battery 21 measured by the electrical current sensor 26, and stores the received current value information of the secondary battery 21 in the storage unit 115. The electrical current value acquisition unit 102 calculates the electrical current value I from the distribution of the electrical current values of the secondary battery 21 acquired during the execution cycle. The electrical current value I may be, for example, an average value calculated from the frequency distribution of the electrical current value flowing through the secondary battery 21 acquired during the execution cycle. Note that as the electrical current value I, it is also possible to adopt the average value or the like of the electrical current value flowing through the secondary battery 21 acquired during the execution cycle in order to reduce the calculation load.

The temperature acquisition unit 101 periodically receives the temperature information of the secondary battery 21 measured by the temperature sensor 27, and stores the received temperature information of the secondary battery 21 in the storage unit 115. The temperature T of the secondary battery 21 is calculated from the temperature distribution of the secondary battery 21 acquired during the execution cycle. The temperature T can be, for example, an average value calculated from the frequency distribution of the temperature of the secondary battery 21 acquired during the execution cycle. Note that as the temperature T, it is also possible to adopt the average value or the like of the temperature of the secondary battery 21 acquired during the execution cycle in order to reduce the calculation load.

In step S2, the SOC calculation unit 104 calculates the integrated value of the electrical current value flowing through the secondary battery 21 acquired during the execution cycle, and calculates the charging rate of the secondary battery 21 based on the integrated value. The SOC calculation unit 104 calculates the charging rate of the secondary battery 21 by a known method using the electrical current value flowing through the secondary battery 21 acquired by the electrical current value acquisition unit 102. The charging rate of the secondary battery 21 indicates the charge state of the secondary battery 21, and the ratio of the remaining capacity with respect to the full charge capacity of the secondary battery 21 is expressed as a percentage. Hereinafter, the charging rate of the secondary battery 21 is referred to as SOC. SOC is an abbreviation for state of charge. The SOC calculation unit 104 is able to calculate the SOC of the secondary battery 21 based on, for example, the integrated value of the electrical current values of the secondary battery 21 acquired by the electrical current value acquisition unit 102. The SOC information calculated by the SOC calculation unit 104 is stored in the storage unit 115.

In step S3, the change amount calculation unit 105 calculates ΔDOD. The change amount calculation unit 105 is able to obtain ΔDOD by the difference between the SOC at the start time $t_s$ and the SOC at the end time $t_c$ of the execution cycle. Note that DOD is an abbreviation for depth of discharge that indicates the depth of discharge of the secondary battery 21.

In step S4, the electrode resistance acquisition unit 107 calculates both the negative electrode resistance $R_a$ and the positive electrode resistance $R_c$ of the secondary battery 21. The electrode resistance acquisition unit 107 calculates the negative electrode resistance $R_a$ and the positive electrode resistance $R_c$ of the secondary battery 21 based on the temperature T of the secondary battery 21, the electrical current value I of the secondary battery 21, the change amount ΔDOD of the SOC, and the closed-circuit potential of the negative electrode or closed-circuit potential of the positive electrode of the secondary battery 21. Here, the temperature T is the temperature T of the secondary battery 21 acquired by the temperature acquisition unit 101 in step S1. The electrical current value I is the electrical current value I of the secondary battery 21 calculated in step S121. The change amount ΔDOD is the change amount ΔDOD of the SOC calculated by the change amount calculation unit 105 in step S3. The closed-circuit potential of the negative electrode and the closed-circuit potential of the positive electrode of the secondary battery 21 are the closed-circuit potentials of the negative electrode and the positive electrode of the secondary battery 21 acquired by the CCP calculation unit 109 in the previous execution cycle. Note that hereinafter, the closed-circuit potential of the negative electrode of the secondary battery 21 is referred to as $CCP_a$, and the closed-circuit potential of the positive electrode of the secondary battery 21 is referred to as $CCP_c$. CCP is an abbreviation for Closed-circuit Potential. The negative electrode resistance $R_a$ may be expressed as a function of the temperature T, $CCP_a$, change amount ΔDOD, and charge/discharge current value I of the secondary battery 21, and the positive electrode resistance $R_c$ may be expressed as a function of the temperature T, $CCP_c$, change amount ΔDOD, and charge/discharge current value I of the secondary battery 21. This will be described below.

First, the negative electrode resistance $R_a$ will be described.

The negative electrode resistance $R_a$ increases due to the formation of a coating film (SEI: Solid Electrolyte Interface) on the surface of the negative electrode due to the redox decomposition of the electrolytic solution of the secondary battery 21 and additives in the electrolytic solution. The coating film is formed by the above-mentioned chemical reaction, and thus the negative electrode resistance $R_a$ follows the Arrhenius law. Therefore, the negative electrode resistance $R_a$ may be expressed by a function of temperature T.

Moreover, formation of the coating film on the negative electrode surface is caused by redox, and thus the Tafel equation is followed. Therefore, the negative electrode resistance $R_a$ may be expressed by a function of the negative electrode $CCP_a$.

Moreover, by repeating the charge/discharge cycle of the secondary battery 21, the active material of the negative electrode is repeatedly expanded and contracted, cracking of the surface coating film progresses, and the surface of the negative electrode is eventually exposed from the cracks in the coating film. The formation of a new coating film on the exposed surface increases the amount of coating film, which causes a further increase in the negative electrode resistance $R_a$. The larger the ΔDOD, the greater the degree of expansion and contraction of the active material. Therefore, the negative electrode resistance $R_a$ may be expressed by a function of ΔDOD.

Moreover, in the negative electrode, the active material itself cracks and the diameter becomes smaller due to the repeated expansion and contraction of the active material as described above. The cracking of the active material itself includes both a factor that lowers the negative electrode resistance $R_a$ and a factor that increases the negative electrode resistance $R_a$. First, due to the cracking of the active material itself, a new surface (in other words, a surface on which no coating film is formed) is formed on the active material, and thus the reaction area increases. Therefore, cracking of the active material itself causes a decrease in the negative electrode resistance $R_a$. On the other hand, when a new surface is formed on the active material, the formation of the coating film is promoted on the new surface, and therefore the amount of coating film increases and the negative electrode resistance $R_a$ also increases. In consideration of the above, the negative electrode resistance $R_a$ may be expressed by a function of ΔDOD based on theory described below.

The pulverization rate, which is the rate at which the active material of the negative electrode is cracked, is expressed as dr/dt, where r is the particle diameter of the active material and t is the time. Here, it is considered that the pulverization rate dr/dt is more likely to proceed as the particle diameter r of the active material becomes larger. In other words, the pulverization rate dr/dt may be considered to be proportional to the particle diameter r of the active material. Therefore, the pulverization rate may be expressed by the following Equation (1).

[Math 1]

$$\frac{dr}{dt} = -k \times r \quad (1)$$

Note that in Equation (1) above, k is a constant, and hereafter, may be referred to as a pulverization constant. By solving this, the following Equation (2) is obtained.

[Math 2]

$$\ln(r) = -k \times t + a \quad (2)$$

Note that in Equation (2), a is a constant.

Furthermore, the degree of expansion and contraction of the active material increases as the ΔDOD of the active material increases, and thus the pulverization constant is considered to be proportional to the ΔDOD. As a result, the following Equation (3) is established.

[Math 3]

$$\ln(k) = \beta \times \Delta DOD + \gamma \quad (3)$$

Note that in Equation (3), β and γ are constants. By solving this, the following Equation (4) is obtained.

[Math 4]

$$k = \eta \times \exp(\zeta \times \Delta DOD) \quad (4)$$

Note that in Equation (4), η and ζ are constants. Then, by combining Equation (2) and Equation (4), the following Equation (5) may be derived.

[Math 5]

$$r(t, \Delta DOD) = r_0 \{1 - A \times \exp[B \times \langle \exp(C \times \Delta DOD) \rangle \times t]\} \quad (5)$$

$$f(t, \Delta DOD) = A \times \exp[B \times \langle \exp(C \times \Delta DOD) \rangle \times t] \quad (6)$$

Note that $r_0$ is the radius of the initial active material (in other words, when t=0), and A, B, and C are constants. As described above, the negative electrode resistance $R_a$ increases due to the formation of a coating film on the negative electrode surface, and the formation rate of the coating film on the negative electrode surface has correlation with the diameter of the active material of the negative electrode, and thus the negative electrode resistance $R_a$ may be expressed by an equation including a pulverization function f (t, ΔDOD), or in other words, a function of ΔDOD. Note that the contents inside the parenthesis on the right side of Equation (5) may be further added to, and corrected by constants. Moreover, in the present embodiment, the constants A, B, and C may be corrected by a learning unit 111 described later.

Furthermore, the cracking of the surface coating film of the negative electrode and the cracking of the negative electrode active material itself depend on the charge/discharge current of the secondary battery 21. In other words, the larger the charge/discharge current value, the more the current flow tends to concentrate at the low resistance portion of the active material, and thus the degree of expansion and contraction may differ depending on the portion of the active material. As a result, strain is likely to occur in the active material, causing cracks in the surface coating film of the negative electrode and causing cracks in the negative electrode active material itself. Therefore, the cracking of the surface coating film of the negative electrode and the cracking of the negative electrode active material itself may be expressed as a function of the charge/discharge current value I or as a function of the C rate that correlates with the charge/discharge current value I. Here, the 1C rate indicates an electrical current value that fully charges or completely discharges the rated capacity of the battery in one hour in the case of constant current charge/discharge measurement.

In summarizing the above, the negative electrode resistance $R_a$ is expressed by the following Equation (7) that uses a function $g_A$ (T, $CCP_a$) that takes into consideration that a coating film is formed on the surface of the active material, a function $g_B$ (T, $CCP_a$, $\Delta DOD$, I) that takes into consideration that the coating film formed on the surface of the active material is cracked, and a function $g_C$ (T, $CCP_a$, $\Delta DOD$, I) that takes into consideration that the active material itself is cracked.

[Math 6]

$$R_a = g_A(T, CCP_a) \times g_B(T, CCP_a, \Delta DOD, I) \times g_C(T, CCP_a, \Delta DOD, I) \quad (7)$$

Based on the above theory, the negative electrode resistance $R_a$ is expressed as a function of the temperature T, $CCP_a$, change amount $\Delta DOD$, and charge/discharge current value I of the secondary battery 21.

Next, the positive electrode resistance $R_c$ will be described.

The positive electrode resistance $R_c$ increases with the alteration of the positive electrode surface. The surface of the positive electrode is altered by chemical reaction, and thus the positive electrode resistance $R_c$ follows the Arrhenius law. Therefore, the positive electrode resistance $R_c$ may be expressed by a function of temperature T.

Moreover, the alteration of the positive electrode surface is caused by reductive decomposition of the positive electrode surface, and thus follows the Tafel equation. Therefore, the positive electrode resistance $R_c$ may be expressed by a function of $CCP_c$.

Furthermore, by repeating the charge/discharge cycle of the secondary battery 21, the expansion and contraction of the active material of the positive electrode is repeated, cracking of the surface of the altered positive electrode active material occurs, and a new surface of the positive electrode that has not been altered is formed. Alteration eventually occurs on the surface of this new positive electrode, causing a further increase in the positive electrode resistance R. The larger the $\Delta DOD$, the greater the degree of expansion and contraction of the active material. Therefore, the positive electrode resistance $R_c$ may be expressed by a function of $\Delta DOD$.

Moreover, the alteration of the surface of the positive electrode is promoted by repeating expansion and contraction of the active material of the positive electrode, progression of cracking of the active material of the positive electrode, and a reduction in the diameter of the active material. The cracking of the active material itself includes both an element that decreases the positive electrode resistance $R_c$ and an element that increases the positive electrode resistance R. First, due to the cracking of the active material itself, a new surface (in other words, a surface before alteration) is formed on the active material, and thus cracking of the active material itself causes a decrease in the positive electrode resistance R. On the other hand, when a new surface is formed on the active material, the new surface is eventually altered and the positive electrode resistance $R_c$ increases. In consideration of the above, based on the same theory as that of the negative electrode resistance $R_a$, the positive electrode resistance $R_c$ may be expressed by an equation including the pulverization function f (t, $\Delta DOD$) of the Equation (6), or in other words, expressed by a function of $\Delta DOD$.

Moreover, cracking of the positive electrode active material itself depends on the charge/discharge current I. In other words, the larger the charge/discharge current value I, the more the current flow tends to concentrate at the low resistance portion of the active material, and thus the degree of expansion and contraction may differ depending on the portion of the active material. As a result, strain is likely to occur in the active material, causing cracking of the positive electrode active material itself. Therefore, cracking of the positive electrode active material itself may be expressed by a function of the charge/discharge current value I or by a function of the C rate that is correlated with the charge/discharge current value I.

In summarizing the above, the positive electrode resistance $R_c$ is expressed as in the following Equation (8) using a function $h_A$ (T, $CCP_a$) that takes into consideration the alteration of the surface of the active material, a function $h_B$ (T, $CCP_a$, $\Delta DOD$, I) that takes into consideration cracking of the altered surface of the active material, and a function $h_C$ (T, $CCP_a$, $\Delta DOD$, I) that takes into consideration cracking of the active material itself.

[Math 7]

$$R_c = h_A(T, CCP_c) \times h_B(T, CCP_c, \Delta DOD, I) \times h_C(T, CCP_c, \Delta DOD, I) \quad (8)$$

Based on the above theory, the positive electrode resistance $R_c$ is expressed as a function of the temperature T, $CCP_c$, change amount $\Delta DOD$, and charge/discharge current value I of the secondary battery 21.

Here, in regard to the $CCP_a$ and $CCP_c$ used in step S4, the $CCP_a$ and $CCP_c$ calculated by the CCP calculation unit 109 in step S7 described later are used in the execution cycle immediately before the current execution cycle. Note that in a case where there are no $CCP_a$ and $CCP_c$ acquired in the previous execution cycle (for example, at system startup, or the like), the initial $CCP_a$ and $CCP_c$ are calculated as follows.

First, the initial negative electrode polarization $\Delta V_a$ is calculated from the product of the electrical current value I acquired in step S1 and the initial value (described later) of the negative electrode resistance $R_a$, and the initial positive electrode polarization $\Delta V_c$ is calculated from the product of the electrical current value I acquired in step S1 and the initial value of the positive electrode resistance R. The initial value of the negative electrode resistance $R_a$ and the initial value of the positive electrode resistance $R_c$ are, for example, the negative electrode resistance and the positive electrode resistance acquired in a secondary battery 21 that are the same type as the secondary battery 21 of this embodiment in the initial state (means the state at the time of shipment of the secondary battery 21) and are stored beforehand in the storage unit 115. The negative electrode resistance $R_a$ and the positive electrode resistance $R_c$ in the initial state may be determined, for example, by an AC impedance method, IV measurement, or the like. Alternatively, by the negative electrode resistance $R_a$ and the positive electrode resistance $R_c$ in the initial state may be determined by disassembling the secondary battery 21 in the initial state, creating a half cell using the positive electrode and a half cell using the negative electrode, and measuring the resistance of each half cell.

Then, based on the initial OCP characteristics (described later) stored in the storage unit 115 and the SOC calculated in step S2, the open circuit potential of the negative electrode of the secondary battery 21 corresponding to the SOC and the open circuit potential of the positive electrode of the secondary battery 21 corresponding to the SOC are acquired. Each open circuit potential is the potential of each electrode of the secondary battery 21 when a state in which the secondary battery 21 and the external circuit are not energized has elapsed for a long period of time. Hereinafter, the open circuit potential of the negative electrode of the secondary battery 21 will be referred to as $OCP_a$, and the open circuit potential of the positive electrode of the secondary battery 21 will be referred to as $OCP_c$. OCP is an abbreviation for Open Circuit Potential. The initial OCP characteristics indicate the relation between SOC and $OCP_a$ and the relation between SOC and $OCP_c$ of the secondary battery 21 in the initial state, and are stored in advance by the storage unit 115. Next, $CCP_a$ is obtained by calculating $OCP_a+\Delta V_a$, and $CCP_c$ is obtained by calculating $OCP_c+\Delta V_c$.

As described above, in a case where there is no $CCP_a$ or $CCP_c$ acquired in the previous execution cycle (for example, in a case where there is no previous execution cycle such as at the time of system startup or the like), the initial $CCP_a$ and $CCP_c$ are calculated.

In step S5, the polarization calculation unit 108 calculates the polarization $\Delta V_a=I\times R_a$ of the negative electrode and calculates the polarization $\Delta V_c=I\times R_c$ of the positive electrode. I is the electrical current value I of the secondary battery 21 acquired by the electrical current value acquisition unit 102 in step S1, and $R_a$ and $R_c$ are the negative electrode resistance $R_a$ and the positive electrode resistance $R_c$ calculated by the electrode resistance acquisition unit 107 in step S4, respectively.

In step S6, the OCP acquisition unit 106 calculates $OCP_a$ and OCP. The OCP acquisition unit 106 acquires the $OCP_a$ and $OCP_c$ based on the SOC of the secondary battery 21 calculated by the SOC calculation unit 104 in step S2, and the updated OCP characteristics calculated in step S10 (described later) in the previous execution cycle and stored in the storage unit 115. The updated OCP characteristics indicate the relation between the SOC and $OCP_a$ and the relation between the SOC and $OCP_c$ of the deteriorated secondary battery 21. Details on how the updated OCP characteristics are acquired will be described in step S10 described later. The $OCP_a$ and $OCP_c$ information acquired by the OCP acquisition unit 106 is stored in the storage unit 115.

In step S7, the CCP calculation unit 109 calculates the $CCP_a$ and $CCP_c$ of the secondary battery 21. The CCP calculation unit 109 acquires the $\Delta V_a$ and $\Delta V_c$ calculated by the polarization calculation unit 108 in step S5, and also acquires the $OCP_a$ and $OCP_c$ acquired by the OCP acquisition unit 106 in step S6. Then, the CCP calculation unit 109 rewrites $OCP_a$ to $CCP_a$ by $OCP_a+\Delta V_a$, and rewrites $OCP_c$ to $CCP_c$ by $OCP_c+\Delta V_c$.

Figure 4A:
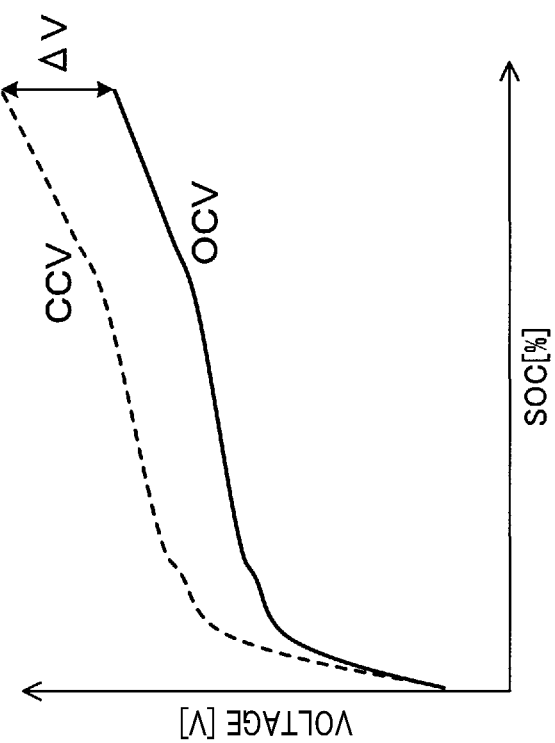
FIG. 4A is a diagram schematically illustrating the relation between the open circuit voltage and the charging rate and the relation between the closed-circuit voltage and the charging rate of a secondary battery before deterioration.
Figure 4B:
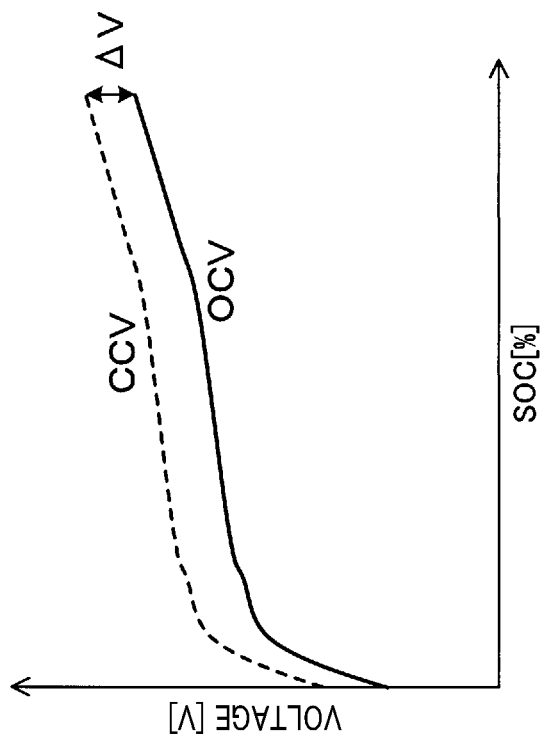
FIG. 4B is a diagram schematically illustrating the relation between the open circuit voltage and the charging rate and the closed-circuit voltage and the charging rate of a secondary battery after deterioration according to the first embodiment.

Here, in the secondary battery 21, polarization becomes apparent due to deterioration. In other words, due to the occurrence of polarization, the closed-circuit voltage of the secondary battery 21 rises when the secondary battery 21 is charged, and the closed-circuit voltage falls when the secondary battery 21 is discharged; however, as the deterioration progresses, the closed-circuit voltage rises further when the secondary battery 21 is charged, and falls further when the secondary battery 21 is discharged. For example, FIG. 4A schematically illustrates the relation between the SOC and voltage during charging of the secondary battery 21 before deterioration, and FIG. 4B schematically illustrates the relation between the SOC and voltage during charging of the secondary battery 21 after deterioration. In FIGS. 4A and 4B, the solid line represents the open circuit voltage and the broken line represents the closed-circuit voltage. In FIGS. 4A and 4B, it is presumed that the voltage scales on the vertical axes match. Note that hereinafter, the open circuit voltage is referred to as OCV, and the closed-circuit voltage is referred to as CCV. OCV is an abbreviation for Open Circuit Voltage, and CCV is an abbreviation for Closed-circuit Voltage.

From FIGS. 4A and 4B, it can be seen that the polarization $\Delta V$ of the secondary battery after deterioration is larger than that before deterioration. In view of this point, the battery deterioration prediction system 1 of the present embodiment rewrites the OCP to a CCP in consideration of the polarization $\Delta V$ in predicting the deterioration of the secondary battery, and predicts the battery capacity QB using the CCP.

Figure 3:
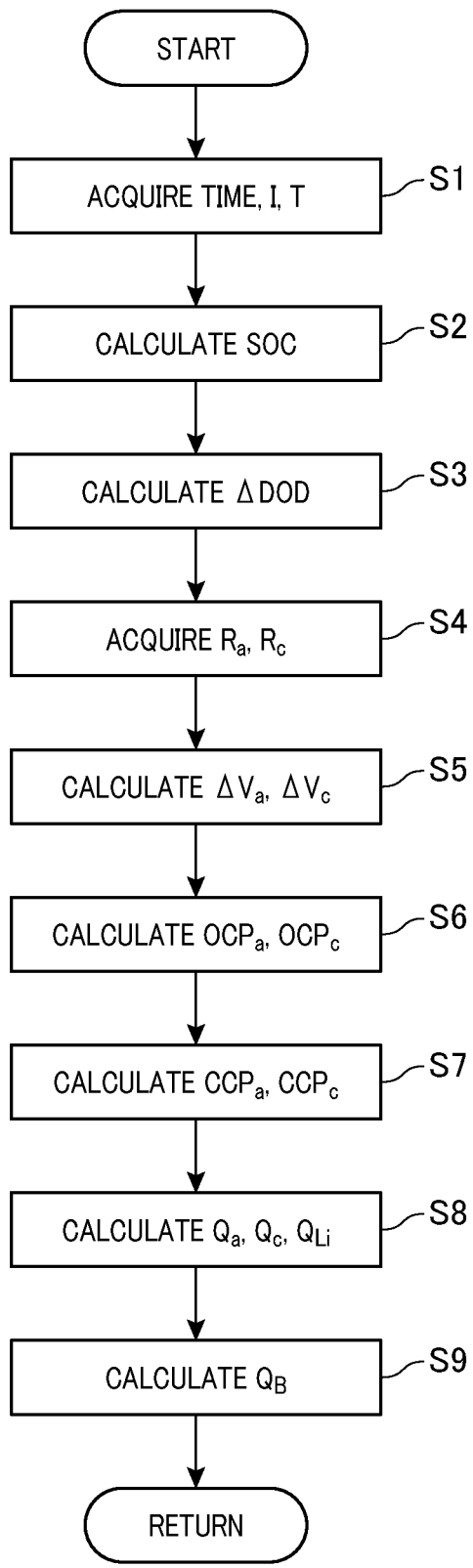
FIG. 3 is a flowchart for explaining a process in which the battery deterioration prediction system predicts the battery capacity QB in the first embodiment.

As illustrated in FIG. 2 and FIG. 3, in step S8, the capacity prediction unit 110 calculates each of the negative electrode capacity $Q_a$, the positive electrode capacity $Q_c$, and the positive/negative electrode SOC capacity deviation $Q_{Li}$ of the secondary battery 21. The capacity prediction unit 110 acquires the $CCP_a$ and $CCP_c$ calculated by the CCP calculation unit 109 in step S7, the temperature T of the secondary battery 21 acquired by the temperature acquisition unit 101 in step S1, and $\Delta DOD$ calculated by the change amount calculation unit 105 in step S3. The capacity prediction unit 110 calculates the negative electrode capacity $Q_a$, the positive electrode capacity $Q_c$, and the positive/negative electrode SOC capacity deviation $Q_{Li}$ of the secondary battery 21 based on at least one of the $CCP_a$ and $CCP_c$, the temperature T of the secondary battery 21, the electrical current value I of the secondary battery 21, and $\Delta DOD$. The negative electrode capacity $Q_a$ corresponds to the number of negative electrode sites into which lithium ions may be inserted. The positive electrode capacity $Q_c$ corresponds to the number of positive electrode sites into which lithium ions may be inserted. The positive/negative electrode SOC capacity deviation $Q_{Li}$ is the deviation between the positive electrode and negative electrode used capacity regions in the secondary battery 21. The positive/negative electrode SOC capacity deviation $Q_{Li}$ corresponds to the number of lithium ions that may migrate between the positive electrode and the negative electrode, and the ease of the movement of the entire lithium ions.

The capacity prediction unit 110 expresses the negative electrode capacity $Q_a$ by the same theory as in the case where the electrode resistance acquisition unit 107 calculates the negative electrode resistance $R_a$. That is, the negative electrode capacity $Q_a$ is expressed as in the following Equation (9) using a function is (T, $CCP_a$) that takes into consideration that a coating film is formed on the surface of the active material, a function $i_B$ (T, $CCP_a$, $\Delta DOD$, I) that takes into consideration cracking of the coating film formed on the surface of the active material, and a function $I_C$ (T, $CCP_a$, $\Delta DOD$, I) that takes into consideration cracking of the active material itself. In other words, the negative electrode capacity $Q_a$ is expressed by a function of the temperature T, the $CCP_a$, the change amount $\Delta DOD$ (in other words, the pulverization function f (t, ΔDOD)), and the charge/discharge current value I of the secondary battery 21.

[Math 8]

$$Q_a = i_A(T, CCP_a) \times i_B(T, CCP_a, \Delta DOD, I) \times i_c(T, CCP_a, \Delta DOD, I) \quad (9)$$

Moreover, the capacity prediction unit 110 expresses the positive electrode capacity $Q_c$ by the same theory as in the case where the electrode resistance acquisition unit 107 calculates the positive electrode resistance R. That is, the positive electrode capacity $Q_c$ is expressed as in the following Equation (10) using a function $J_A$ (T, $CCP_c$) that takes into consideration the alteration of the surface of the active material, a function $J_B$ (T, $CCP_c$, ΔDOD, I) that takes into consideration cracking of the altered surface of the active material, and a function $J_C$ (T, $CCP_c$, ΔDOD, I) that takes into consideration cracking of the active material itself. In other words, the positive electrode capacity $Q_c$ is expressed by a function of the temperature T, the $CCP_c$, the change amount ΔDOD (in other words, the pulverization function f (t, ΔDOD)), and the charge/discharge current value I of the secondary battery 21.

[Math 9]

$$Q_c = j_A(T, CCP_c) \times j_B(T, CCP_c, \Delta DOD, I) \times j_c(T, CCP_c, \Delta DOD, I) \quad (10)$$

The positive/negative electrode SOC capacity deviation $Q_{Li}$ correlates with the consumption of lithium ions due to the formation of a coating film (SEI: Solid Electrolyte Interface) on the negative electrode and the positive electrode. Such consumption of lithium ions is a chemical reaction, and thus the positive/negative electrode SOC capacity deviation $Q_{Li}$ follows the Arrhenius law. Therefore, the positive/negative electrode SOC capacity deviation $Q_{Li}$ may be expressed by a function of temperature T.

The consumption of lithium ions by forming a coating film on the negative electrode and the positive electrode is a redox reaction, and thus follows the Tafel equation. Therefore, the positive/negative electrode SOC capacity deviation $Q_{Li}$ may be expressed by functions of $CCP_a$ and $CCP_c$.

Moreover, by repeating the charge/discharge cycle of the secondary battery 21, the expansion and contraction of the active material of each electrode (in other words, the negative electrode and the positive electrode) is repeated, and cracking of the surface coating film of the active material of each electrode progresses. As a result, the surface of each electrode is eventually exposed from the cracks in the coating film. The formation of a new coating film on this exposed surface increases the consumption of lithium ions. The larger the ΔDOD, the greater the degree of expansion and contraction of the active material. Therefore, the positive/negative electrode SOC capacity deviation $Q_{Li}$ may be expressed by a function of ΔDOD.

Moreover, in each electrode, the active material itself cracks and the diameter becomes smaller due to the repeated expansion and contraction of the active material as described above. The cracking of the active material itself has both an element that increases the positive/negative electrode SOC capacity deviation Qu and an element that decreases the positive/negative electrode SOC capacity deviation Qu. First, a new surface (in other words, a surface on which no coating film is formed) is formed on the active material due to cracking of the active material itself, and thus lithium ions may easily move to the active material of each electrode, and causes an increase in the positive/negative electrode SOC capacity deviation $Q_{Li}$. On the other hand, when a new surface is formed on the active material, formation of a coating film on the new surface is promoted and lithium ions are consumed, which causes a decrease in the positive/negative electrode SOC capacity deviation $Q_{Li}$. In consideration of the above, the positive/negative electrode SOC capacity deviation $Q_{Li}$ may be expressed by an equation including a pulverization function f (t, ΔDOD), or in other words, a function of ΔDOD, based on the same theory as for the negative electrode resistance $R_a$ and the positive electrode resistance R.

Moreover, cracking of the active material itself of each electrode depends on the charge/discharge current I. In other words, the larger the charge/discharge current value I, the more the current flow tends to concentrate at the low resistance portion of the active material, and thus the degree of expansion and contraction may differ depending on the portion of the active material. As a result, strain is likely to occur in the active material, causing cracking of the active material itself. Therefore, cracking of the positive electrode active material itself may be expressed by a function of the charge/discharge current value I or by a function of the C rate that is correlated with the charge/discharge current value I.

In summarizing the above, the positive/negative electrode SOC capacity deviation $Q_{Li}$ is expressed such as by the following Equation (11) using a function $k_A$ (T, $CCP_a$) that takes into consideration the formation of a coating film on the surface of the active material of the negative electrode, a function $k_B$ (T, $CCP_a$, ΔDOD, I) that takes into consideration cracking of the coating film formed on the surface of the active material of the negative electrode, a function $k_C$ (T, $CCP_a$, ΔDOD, I) that takes into consideration cracking of the active material itself of the negative electrode, a function $l_A$ (T, CM) that takes into consideration the formation of a coating film on the surface of the active material of the positive electrode, a function $l_B$ (T, $CCP_c$, ΔDOD, I) that takes into consideration cracking of the coating film formed on the surface of the active material of the positive electrode, and a function $l_C$ (T, $CCP_c$, ΔDOD, I) that takes into consideration cracking of the active material itself of the positive electrode.

[Math 10]

$$Q_{Li} = k_A(T, CCP_a) \times k_B(T, CCP_a, \Delta DOD, I) \times k_C(T, CCP_a, \Delta DOD, I) + l_A(T, CCP_c) \times l_B(T, CCP_c, \Delta DOD, I) \times l_c(T, CCP_c, \Delta DOD, I) \quad (11)$$

As described above, the positive/negative electrode SOC capacity deviation $Q_{Li}$ may be expressed as a function of the temperature T, $CCP_a$, $CCP_c$, change amount ΔDOD, and charge/discharge current value I of the secondary battery 21.

In step S9, the capacity prediction unit 110 obtains the battery capacity $Q_B$ by $Q_B = \min(Q_a, Q_c, Q_{Li})$. In other words, the capacity prediction unit 110 determines that the smallest of the negative electrode capacity $Q_a$, positive electrode capacity $Q_c$, and positive/negative electrode SOC capacity deviation $Q_{Li}$ of the secondary battery 21 is the battery capacity (in other words, full charge capacity) of the secondary battery 21. As described above, the negative electrode capacity $Q_a$ corresponds to the number of negative electrode sites into which lithium ions may be occluded, and the positive electrode capacity $Q_c$ corresponds to the number of positive electrode sites into which lithium ions may be inserted. The positive/negative electrode SOC capacity deviation $Q_{Li}$ corresponds to the number of lithium ions that may move between the positive electrode and negative electrode. Therefore, the smallest of the negative electrode capacity $Q_a$, the positive electrode capacity $Q_c$, and the positive/negative electrode SOC capacity deviation $Q_{Li}$ corresponds to the battery capacity $Q_B$ of the secondary battery 21.

Here, the secondary battery 21 with large current, such as used for driving an automobile or the like, is often used in a range where, of the negative electrode capacity $Q_a$, the positive electrode capacity $Q_c$ and the positive/negative electrode SOC capacity deviation $Q_{Li}$ of the secondary battery 21, only the positive/negative electrode SOC capacity deviation $Q_{Li}$ is a minimum. In other words, in the secondary battery 21 with large current, the battery capacity $Q_B$ is often the positive/negative electrode SOC capacity deviation $Q_{Li}$. As described above, the positive/negative electrode SOC capacity deviation $Q_{Li}$ may be expressed by the above Equation (11). Then, as described above, when calculating the positive/negative electrode SOC capacity deviation $Q_{Li}$, the formation of a coating film on the surfaces of the active material of the negative electrode and the positive electrode, and cracking of the coating film formed on the surface of each active material of the negative electrode and the positive electrode, and cracking of the active material itself of the negative electrode and the positive electrode are taken into consideration, so the positive/negative electrode SOC capacity deviation $Q_{Li}$ is calculated with high accuracy. Together with this, when the battery capacity $Q_B$ is expressed by the positive/negative electrode SOC capacity deviation $Q_{Li}$, the battery capacity $Q_B$ is also calculated with high accuracy. This will be explained below.

Figure 5:
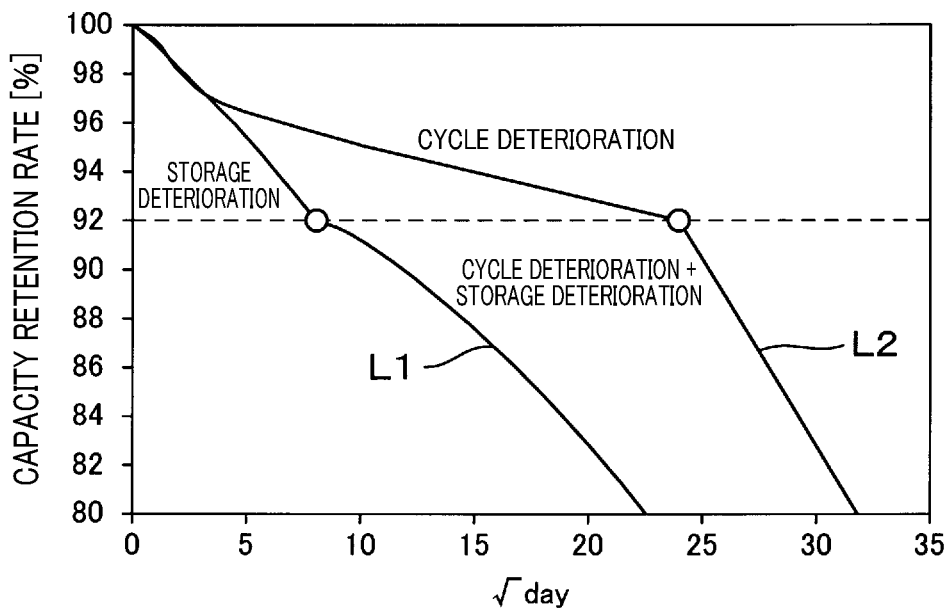
FIG. 5 is a graph illustrating how a first battery and a second battery deteriorate according to the first embodiment.

Here, the following simulation was performed with the presumption that there are two secondary batteries of the same type (hereinafter, for convenience, they are distinguished as a first battery and a second battery, however the batteries are of the same type). The result of the simulation is illustrated in FIG. 5. The horizontal axis of the graph in FIG. 5 indicates the square root of the number of days, and the vertical axis shows the capacity retention of the secondary battery. Note that the capacity retention of the secondary battery is the ratio of the capacity of the secondary battery at the present time to the capacity of the secondary battery in the initial state. Moreover, in FIG. 5, the result for the first battery is indicated by line L1, and the experimental result for the second battery is indicated by line L2. In the results for both the first battery and the second battery illustrated in FIG. 5, the positive/negative electrode SOC capacity deviation $Q_{Li}$ is the smallest among the negative electrode capacity $Q_a$, the positive electrode capacity $Q_c$, and the positive/negative electrode SOC capacity deviation $Q_{Li}$, and the battery capacity $Q_B$=positive/negative electrode SOC capacity $Q_{Li}$. The capacity retention in FIG. 5 is the ratio of the positive/negative electrode SOC capacity $Q_{Li}$ after deterioration to the capacity of the secondary battery in the initial state.

For the first battery, the capacity retention was reduced from the state of a capacity retention of 100% to a capacity retention of 92% by storage deterioration of the first battery in an environment of 45° C. The amount of decrease in the capacity of the first battery during storage deterioration from a capacity retention of 100% to a capacity retention of 92% due to the formation of a coating film on each electrode was 7.2%, due to cracking of the coating film formed on the surface of the active material of each electrode was 0.4%, and due to cracking of the active material itself of each electrode was 0.4%.

For the second battery, the capacity retention was reduced from the state of a capacity retention of 100% to a capacity retention of 92% by storing and deteriorating the second battery in an environment of 45° C. The amount of decrease in the capacity of the second battery when stored and deteriorated from a capacity retention of 100% to a capacity retention of 92% due to the formation of a coating film on each electrode was 4.0%, due to cracking of the coating film formed on the surface of the active material of each electrode was 1.6%, and due to cracking of the active material itself of each electrode was 2.4%.

In other words, even when the first battery and the second battery have the same capacity retention and positive/negative electrode SOC capacity $Q_{Li}$, the values of the functions $k_A$, $k_B$, $k_C$, $l_A$, $l_B$, and $l_C$ of the Equation (11) of the positive/negative electrode SOC capacity $Q_{Li}$ differ between the first battery and the second battery depending on the usage conditions up to that point.

Then, the first battery and the second battery having a capacity retention of 92% were deteriorated under the same conditions by combining cycle deterioration and storage deterioration. As a result, as illustrated in FIG. 5, it can be seen that the second battery that undergoes cycle deterioration first deteriorates faster than the first battery that undergoes storage deterioration first (in other words, the slope of the graph in the region of the capacity retention of 92% or less in FIG. 5 becomes large). From this, it can be seen that even when the secondary batteries have the same capacity retention, the degree of deterioration of the secondary battery thereafter differs depending on the usage status of the secondary battery up to that point. From this, it can be seen that the battery capacity $Q_B$ may be calculated with high accuracy by calculating the positive/negative electrode SOC capacity deviation $Q_{Li}$ based on the functions $k_A$ and $l_A$ that take into consideration the formation of a coating film on each electrode, the functions $k_B$ and $l_B$ that take into consideration cracking of the film formed on the surface of the active material of each electrode, and the functions $k_C$ and $l_C$ that take into consideration cracking of the active material itself. Note that the same applies when the battery capacity $Q_B$ is the negative electrode capacity $Q_a$ or the positive electrode capacity $Q_c$.

Next, referring to FIG. 2 and FIG. 6, the step of the battery deterioration prediction system 1 controlling the current flowing through the secondary battery 21 by using the negative electrode capacity $Q_a$, positive electrode capacity $Q_c$, and positive/negative electrode SOC capacity deviation $Q_{Li}$ of the secondary battery 21 calculated in step S9 of FIG. 3 will be described. First, in step S10, the OCV characteristic calculation unit 112 calculates the updated OCP characteristic. In step S10, the initial OCP characteristic stored in the storage unit 115 is updated based on the negative electrode capacity $Q_a$, the positive electrode capacity $Q_c$, and the positive/negative electrode SOC capacity deviation $Q_{Li}$ calculated in step S8 described above. The initial OCP characteristic indicates the relation between SOC and $OCP_a$ and the relation between SOC and $OCP_c$ of the secondary battery 21 in the initial state. The method for updating the initial OCP characteristic is not particularly limited, and for example, a well-known method may be adopted. An example of the updated OCP characteristic is illustrated in FIG. 7.

Figure 6:
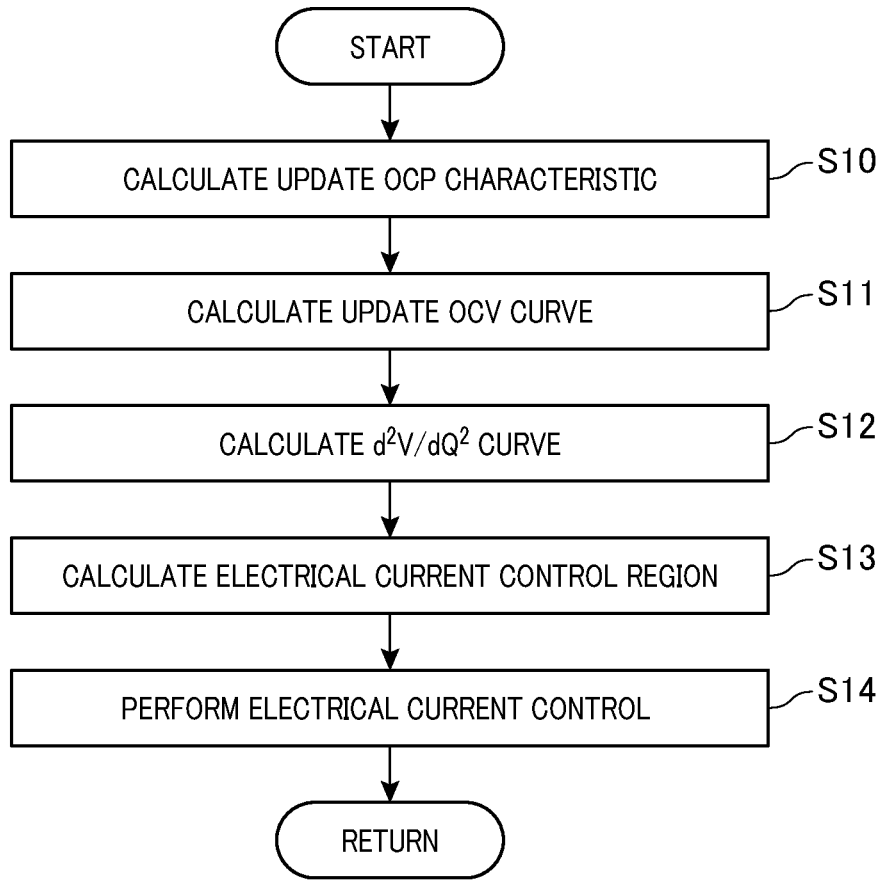
FIG. 6 is a flowchart for explaining a process in which a battery deterioration prediction system controls a current flowing through a secondary battery by using a negative electrode capacity $Q_a$, a positive electrode capacity $Q_c$, and a positive/negative electrode SOC capacity deviation $Q_{Li}$ of the secondary battery according to the first embodiment.
Figure 7:
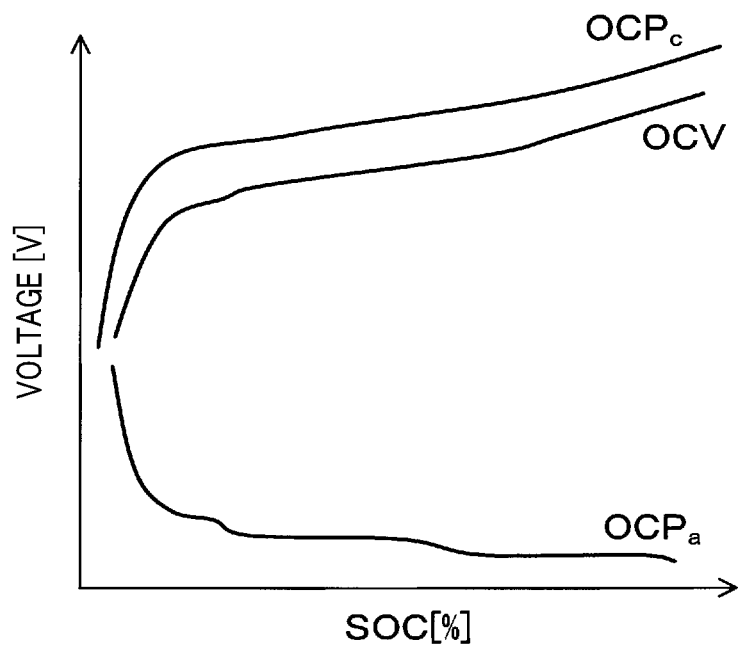
FIG. 7 is a schematic diagram illustrating an updated OCP characteristic and an updated OCV characteristic according to the first embodiment.

As illustrated in FIG. 2 and FIG. 6, in step S11, the OCV characteristic calculation unit 112 calculates the updated OCV characteristic. As the updated OCV characteristic, the updated OCV characteristic, which is the relation between the SOC and OCV of the deteriorated secondary battery 21, is calculated from the updated OCP characteristic calculated in step S10 by taking the difference between the $OCP_c$ and the $OCP_a$. An example of the updated OCV characteristic is illustrated in FIG. 7.

Figure 8:
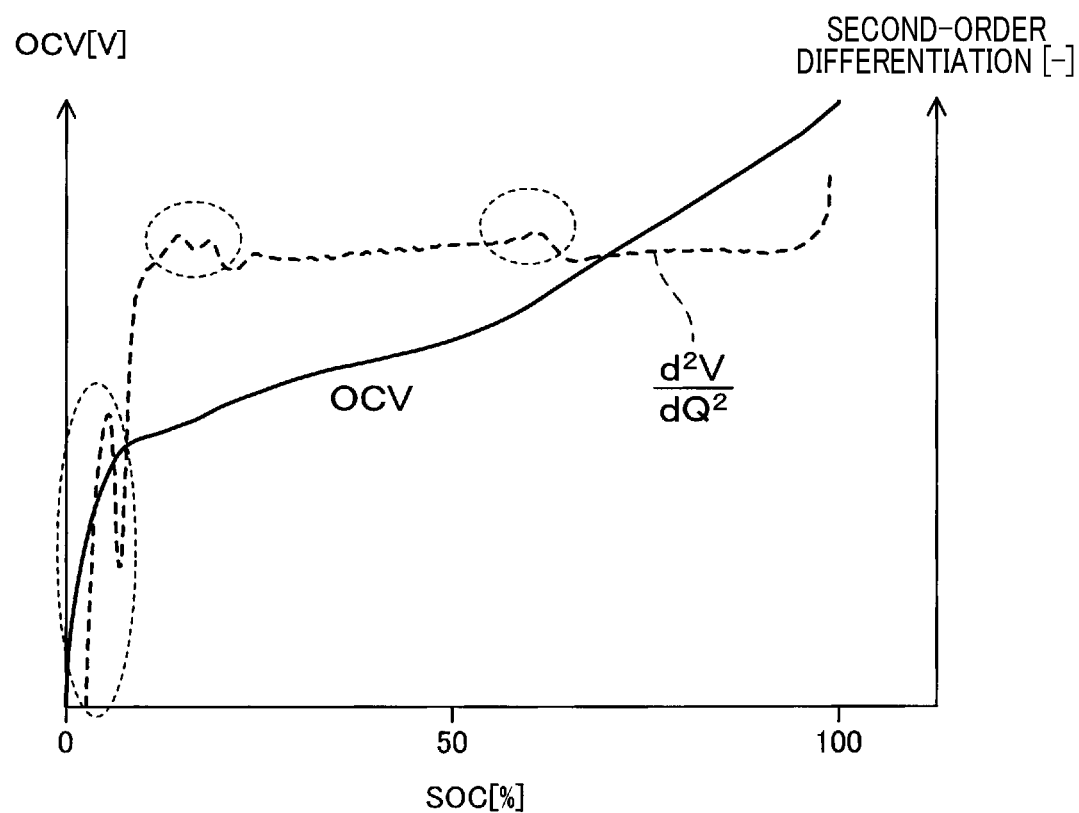
FIG. 8 is a schematic diagram illustrating an updated OCV characteristic and a differential characteristic according to the first embodiment.

As illustrated in FIG. 2 and FIG. 6, in step S12, the differential characteristic calculation unit 113 calculates the differential characteristic based on the updated OCV characteristic calculated by the OCV characteristic calculation unit 112 in step S11. The differential characteristic is the relation between the SOC of the secondary battery 21 and the differential value obtained by first-order or second-order differentiation of the OCV of the secondary battery 21 by the SOC. As illustrated in FIG. 6, in step S12 of this embodiment, the differential characteristic calculation unit 113 calculates the $d^2V/dQ^2$ curve. The $d^2V/dQ^2$ curve is a graph illustrating the relation between the SOC of the secondary battery 21 and the differential value obtained by second-order differentiation of the OCV, and is a kind of differential characteristic. FIG. 8 illustrates a curve in which OCV is differentiated by second-order differentiation by the SOC.

As illustrated in FIG. 2 and FIG. 6, in step S13, the electrical current control unit 114 calculates the electrical current control region. In other words, in this step S13, the SOC region in which the peak on the $d^2V/dQ^2$ curve illustrated in FIG. 8 is equal to or greater than the threshold value (for example, the SOC region surrounded by the broken line in FIG. 8) is calculated.

As illustrated in FIG. 2 and FIG. 6, in step S14, the electrical current control unit 114 performs control so when the SOC of the secondary battery 21 reaches the SOC region where the peak calculated in step S13 exceeds the threshold value, the electrical current value flowing through the secondary battery 21 is reduced. In other words, when the secondary battery 21 is at the SOC calculated in step S13, the electrical current control unit 114 performs control so that the electrical current value of current flowing through the secondary battery 21 is smaller than the electrical current value of current flowing through the secondary battery 21 in a region other than the SOC region. As a result, deterioration of the secondary battery 21 may be suppressed. This will be described below.

In the curve illustrating the differential characteristic, when the peak is equal to or greater than a specified threshold value, it is considered that the OCV fluctuation is relatively large and the expansion and contraction is large. In other words, in the SOC region where the peak is equal to or greater than the threshold value, the expansion and contraction of the active material is greater, and thus the higher the applied current is, the more strain is likely to occur in the active material, and the more cracking of the active material is likely to be promoted. Therefore, the electrical current control unit 114 performs control so as to limit the current flowing through the secondary battery 21 in the SOC region where the peak is equal to or greater than the threshold value. As a result, it is possible to suppress cracking of the active material. Moreover, by detecting a peak equal to or greater than the threshold value, the electrical current control unit 114 prevents the electrical current value from being limited in noise regions (or in other words, SOC regions in which a relatively small peak appears).

As described above, the current flowing through the secondary battery 21 may be controlled by using the negative electrode capacity $Q_a$, the positive electrode capacity $Q_c$, and the positive/negative electrode SOC capacity deviation $Q_{Li}$ of the secondary battery 21.

Moreover, as illustrated in FIG. 2, the battery deterioration prediction system 1 of the present embodiment includes the above-mentioned learning unit 111. The learning unit 111 may be configured to perform update by learning a prediction equation for predicting at least one of the negative electrode resistance $R_a$, the positive electrode resistance $R_c$, the negative electrode capacity $Q_a$, the positive electrode capacity $Q_c$, and the positive/negative electrode SOC capacity deviation $Q_{Li}$ of the secondary battery and the battery capacity $Q_B$ of the secondary battery. The prediction equation that the learning unit 111 updates by learning is not limited, and in the present embodiment, the learning unit 111 updates by learning the constants A, B and C of the pulverization function f (t, ΔDOD) used for calculation of the negative electrode resistance $R_a$ and the positive electrode resistance $R_c$, and by the electrode resistance acquisition unit 107, and the negative electrode capacity $Q_a$, the positive electrode capacity $Q_c$, and the positive/negative electrode SOC capacity deviation $Q_{Li}$ by the capacity prediction unit 110. The learning unit 111 may perform correction by fitting, for example. For example, the learning unit 111 performs learning of A, B and C by calculating the measurement value of the battery capacity $Q_B$ of the secondary battery 21 based on the integration of the secondary battery 21 acquired by the electrical current value acquisition unit 102, and calculating the constants A, B, and C that will minimize the error between the measurement value and the battery capacity $Q_B$ calculated by the capacity prediction unit 110. Note that it is also possible to learn the constants A, B, and C so as to minimize the error between the other measurement values and theoretical values.

The learning unit 111 is configured by a BMU mounted in a vehicle; however, may be configured, for example, by an information processing system arranged outside the vehicle. In this case, for example, a DCM (Data Communication Module), which is a communication device having mobility, may be mounted in a vehicle, and a BCU and an ECU inside the vehicle may be configured to communicate with the information processing system outside the vehicle via the DCM. Moreover, instead of a DCM, for example, a mobile terminal (smartphone or the like) may be adopted. In addition, as the communication means between the BCU and ECU in the vehicle and the information processing system outside the vehicle, various short-range wireless transmission methods such as WiFi (registered trademark), Bluetooth (registered trademark) and the like may be adopted. Furthermore, the information processing system outside the vehicle may be in a stationary form or in a mobile form. Further, for example, it may be a control device that is installed latter and connected to a connector provided in the ECU or BMU of the vehicle. Then, the electrode resistance acquisition unit 107 and the capacity prediction unit 110 use the updated constants A, B, and C perform calculation of the negative electrode resistance $R_a$, the positive electrode resistance $R_c$, the negative electrode capacity $Q_a$, the positive electrode capacity $Q_c$, and the positive/negative electrode SOC capacity deviation Qu.

Note that in this embodiment at least one of the functions $g_A$, $g_B$, $g_C$, $h_A$, $h_B$, $h_C$, $i_A$, $i_B$, $i_C$, $j_A$, $j_B$, $j_C$, $k_A$, $k_B$, $k_C$, $l_A$, $l_B$ and $l_C$ included in Equations (7) to (11) above for calculating the negative electrode resistance $R_a$, the positive electrode resistance $R_c$, the negative electrode capacity $Q_a$, the positive electrode capacity $Q_c$, and the positive/negative electrode SOC capacity deviation $Q_{Li}$ may include any of the elapsed time t from the start of use of the secondary battery, the number of charge/discharge cycles N, and the throughput Ah indicating the integrated current value during charge/ discharge as a further variable. Note that further variables included in the function may be appropriately selected and may be in any combination.

Next, the operational effect of this embodiment will be described.

The battery deterioration prediction system 1 of the above aspect includes a CCP calculation unit 109 that calculates the $CCP_a$ based on the $OCP_a$ and polarization $\Delta V_a$, and calculates the $CCP_c$ based on the $OCP_c$ and polarization $\Delta V_c$. Then, the capacity prediction unit 110 predicts the negative electrode capacity $Q_a$, the positive electrode capacity $Q_c$, and the positive/negative electrode SOC capacity deviation $Q_{Li}$ based on the $CCP_a$ and $CCP_c$, and predicts the battery capacity $Q_B$ of the secondary battery 21 based on the predicted negative electrode capacity $Q_a$, the positive electrode capacity $Q_c$, and the positive/negative electrode SOC capacity deviation $Q_{Li}$ of the secondary battery 21. By predicting the battery capacity $Q_B$ of the secondary battery 21 while taking into consideration the polarizations $\Delta V_a$ and $\Delta V_c$, the battery capacity $Q_B$ may be predicted taking into consideration the polarization that becomes apparent as the secondary battery 21 deteriorates, and prediction of battery capacity $Q_B$ becomes highly accurate.

Moreover, the electrode resistance acquisition unit 107 and the capacity prediction unit 110 use a plurality of functions $g_A$, $g_B$, $g_C$, $i_A$, $i_B$, and $i_C$ having correlations with a plurality of deterioration factors in the negative electrode of the secondary battery 21, and calculate both the negative electrode resistance $R_a$ and the negative electrode capacity $Q_a$. In addition, the electrode resistance acquisition unit 107 and the capacity prediction unit 110 use a plurality of functions $h_A$, $h_B$, $h_C$, $j_A$, $j_B$, and $j_C$ having correlations with a plurality of deterioration factors in the positive electrode of the secondary battery 21 and calculate both the positive electrode resistance $R_c$ and the positive electrode capacity $Q_c$. Furthermore, the capacity prediction unit 110 uses a plurality of functions $k_A$, $k_B$, $k_C$, $l_A$, $l_B$, and $l_C$ having correlations with a plurality of deterioration factors in the electrolyte of the secondary battery 21 and calculates the positive/negative electrode SOC capacity deviation $Q_{Li}$. As a result, accurate negative electrode capacity $Q_a$, positive electrode capacity $Q_c$, positive/negative electrode SOC capacity deviation $Q_{Li}$, negative electrode resistance $R_a$, and positive electrode resistance $R_c$ that take into consideration various deterioration factors (in other words, film coating formation, cracking of the coating film, and cracking of the active material itself, or the like) of each part of the secondary battery 21 may be predicted.

Moreover, the electrode resistance acquisition unit 107 and the capacity prediction unit 110 predict at least one of the negative electrode capacity $Q_a$, positive electrode capacity $Q_c$, positive/negative electrode SOC capacity deviation $Q_{Li}$, negative electrode resistance $R_a$ and positive electrode resistance $R_c$ based on the pulverization function pulverization function f (t, $\Delta DOD$)=A×exp {=B×exp (C×$\Delta DOD$)×t}. As a result, at least one of the negative electrode capacity $Q_a$, positive electrode capacity $Q_c$, positive/negative electrode SOC capacity deviation $Q_{Li}$, negative electrode resistance $R_a$ and positive electrode resistance $R_c$ that reflects the pulverization of the electrodes of the secondary battery 21 due to repeated charging and discharging of the secondary battery 21, and thus these values may be predicted with high accuracy.

Furthermore, the battery deterioration prediction system 1 includes a learning unit 111 that updates the constants A, B, and C of the pulverization function by learning. Therefore, the pulverization function may be updated according to the deterioration state of the secondary battery 21, and a timely pulverization function may be obtained. As a result, it is possible to improve the calculation accuracy of the negative electrode capacity $Q_a$, the positive electrode capacity $Q_c$, the positive/negative electrode SOC capacity deviation $Q_{Li}$, the negative electrode resistance $R_a$, and the positive electrode resistance $R_c$ that are predicted by using the pulverization function.

In addition, in the battery deterioration prediction system 1, at least a part other than the learning unit 111 is mounted in the vehicle and used, and the learning unit 111 is provided outside the vehicle. Therefore, it is not necessary to provide hardware for performing processing by the learning unit 111 in the vehicle, and thus it is easy to reduce the load on the system in the vehicle.

Moreover, the battery deterioration prediction system 1 includes an electrical current control unit 114 that, based on the differential characteristic calculated by the differential characteristic calculation unit 113, limits the current flowing in the secondary battery 21 in a region of current amount where the peak of the differential value is above a threshold value. In other words, as described above, the electrical current control unit 114 limits the amount of current flowing in the secondary battery 21 in a region of current amount in which the active material of the electrode of the secondary battery 21 is likely to be cracked. As a result, in the secondary battery 21, the progression of cracking of the active material of the electrode may be suppressed, and thereby the progression of deterioration of the secondary battery 21 may be suppressed.

As described above, according to this embodiment, it is possible to provide a battery deterioration prediction system capable of predicting the degree of deterioration of a secondary battery with high accuracy.

In the first embodiment, the above Equations (7) to (11) are used to calculate the negative electrode resistance $R_a$, the positive electrode resistance $R_c$, the negative electrode capacity $Q_a$, the positive electrode capacity $Q_c$, and the positive/negative electrode SOC capacity deviation $Q_{Li}$; however, instead of this, it is possible to use an equation in which the operator between the functions in each expression is changed to +. In other words, instead of the above Equations (7), (8), (9), (10), and (11), the following Equations (7A), (8A), (9A), (10A), and (11A) may be used, respectively.

[Math 11]

$$R_a = g_A(T, CCP_a) + g_B(T, CCP_a, \Delta DOD, I) + g_C(T, CCP_a, \Delta DOD, I) \tag{7A}$$

[Math 12]

$$R_c = h_A(T, CCP_c) + h_B(T, CCP_c, \Delta DOD, I) + h_C(T, CCP_c, \Delta DOD, I) \tag{8A}$$

[Math 13]

$$Q_a = i_A(T, CCP_a) + i_B(T, CCP_a, \Delta DOD, I) + i_c(T, CCP_a, \Delta DOD, I) \tag{9}$$

[Math 14]

$$Q_c = j_A(T, CCP_c) + j_B(T, CCP_c, \Delta DOD, I) + j_c(T, CCP_c, \Delta DOD, I) \tag{10}$$

[Math 15]

$$Q_{Li}=k_A(T,CCP_a)+k_B(T,CCP_a,\Delta DOD,I)+k_C(T,CCP_a,\Delta DOD,I)+l_A(T,CCP_c)+l_B(T,CCP_c,\Delta DOD,I)+l_c(T,CCP_c,\Delta DOD,I) \quad (11)$$

Moreover, the operator is not limited to these, and any operator between the functions in the above Equations (7) to (11) may be adopted, and the operators between the functions in the same equation may be the same, or may be different. Regardless of which operator is used in each of the above equations, the same effects as those in the first embodiment may be obtained.

Second Embodiment

In the first embodiment described above, the learning unit 111 updates the constants A, B, and C of the pulverization function by learning; however, updating by learning in the learning unit 111 is not limited to this, and the prediction equation for the battery state of the secondary battery 21 may be updated by learning based on the usage history. The battery state of the secondary battery 21 may, for example, by taken to be the negative electrode resistance $R_a$, the positive electrode resistance $R_c$, the negative electrode capacity $Q_a$, the positive electrode capacity $Q_c$, and the positive/negative electrode SOC capacity deviation $Q_{Li}$ of the secondary battery 21, and the battery capacity $Q_B$ of the secondary battery.

The prediction equation may be a prediction equation for predicting at least one kind of battery information described above. For example, equations represented by the Equations (7) to (11) or the Equations (7A) to (11A) in the first embodiment may be adopted. Note that it may be understood that the pulverization function in the first embodiment forms a part of the prediction equation.

The learning unit 111 may, for example, update the prediction equation as described below. First, the learning unit 111 calculates by machine learning a relational expression using the state estimation amount obtained from the usage history as an explanatory variable and the battery state of the secondary battery 21 as an objective variable. The form of the relational expression is not limited, and may for example, be in the form of a linear or multi-order model function, a map, or the like.

Then, from the above relational expression, the learning unit 111 calculates an estimated value for the battery state of the secondary battery 21 as a true value. After that, the learning unit 111 compares the estimated value with the predicted value of the battery state obtained from the prediction equation of the secondary battery 21 prepared in advance, and updates the prediction equation based on the comparison result. For example, in a case where the comparison result indicates that the difference between the estimated value and the predicted value is larger than a preset reference value, the learning unit 111 updates the prediction equation so that the difference becomes smaller.

The usage history is not limited as long as it relates to the use of the secondary battery 21; however, in a case where the secondary battery 21 is mounted in a vehicle, the traveling data of the vehicle may be adopted as the usage history. Moreover, examples of the state estimation amount obtained from the usage history may include the voltage behavior at the end of charging or the end of discharging of the secondary battery 21, the voltage relaxation behavior after a charging pause or discharge pause, and the AC impedance of a specific frequency. Note that the usage history may be stored in the storage unit 115. Furthermore, the usage history may be stored in an external storage device provided outside the battery deterioration prediction system 1, and the learning unit 111 may read the usage history stored in the external storage device as needed.

As a machine learning method for calculating the above relational expression based on the usage history, a known method may be adopted, and for example, a regression method, a support vector machine, a neural network, or the like may be adopted. Examples of a regression method may include linear regression, multiple regression, logistic regression, and Gaussian process regression.

In addition, the target of the update by learning by the learning unit 111 is not limited, and may be a constant in the deterioration prediction equation, for example, may be at least one constant in the deterioration prediction equation represented by Equations (7) to (11) or Equations (7A) to (11A).

In this second embodiment, the traveling data of the vehicle is adopted as the usage history, and the voltage behavior at the end of charging of the secondary battery 21 is adopted as the state estimation amount obtained from the usage history. Note that configurations not particularly mentioned in the second embodiment have the same configurations as those in the first embodiment illustrated in FIG. 2, and the same reference numerals as those in the first embodiment are assigned and descriptions thereof will be omitted.

In this second embodiment, the DC resistance of a specific time constant in the charged state is acquired as the voltage behavior at the end of charging. Note that the final stage of charging means a period during which the SOC is charged to 90% or more. Then, as the DC resistance, the difference $R_{4\ sec}-R_{2\ sec}$ between the DC resistance value $R_{4\ sec}$ when the secondary battery 21 is discharged at a constant current for 4 seconds and the DC resistance value $R_{2\ sec}$ when the secondary battery 21 is discharged at a constant current for 2 seconds is acquired. In this second embodiment, although not illustrated, a voltage sensor for detecting the voltage value of the secondary battery 21 and a voltage acquisition unit for acquiring the voltage value detected by the voltage sensor are provided. The DC resistance value $R_{4\ sec}$ may be calculated as $\Delta V_{4\ sec}/I$ using the voltage change amount $\Delta V_{4\ sec}$ during constant current discharge for 4 seconds acquired by the voltage acquisition unit and the electrical current value acquisition unit 102, and the electrical current value I flowing through the secondary battery 21. Similarly, the DC resistance value $R_{2\ sec}$ may be calculated as $\Delta V_{2\ sec}/I$ using the voltage change amount $\Delta V_{2\ sec}$ during constant current discharge for 2 seconds acquired by the voltage acquisition unit and the electrical current value acquisition unit 102, and the electrical current value I flowing through the secondary battery 21. Note that calculation of the DC resistance value $R_{4\ sec}$ may be performed by the learning unit 111 or by another calculation unit.

The update flow for updating the prediction equation in the second embodiment will be described below.

Figure 9:
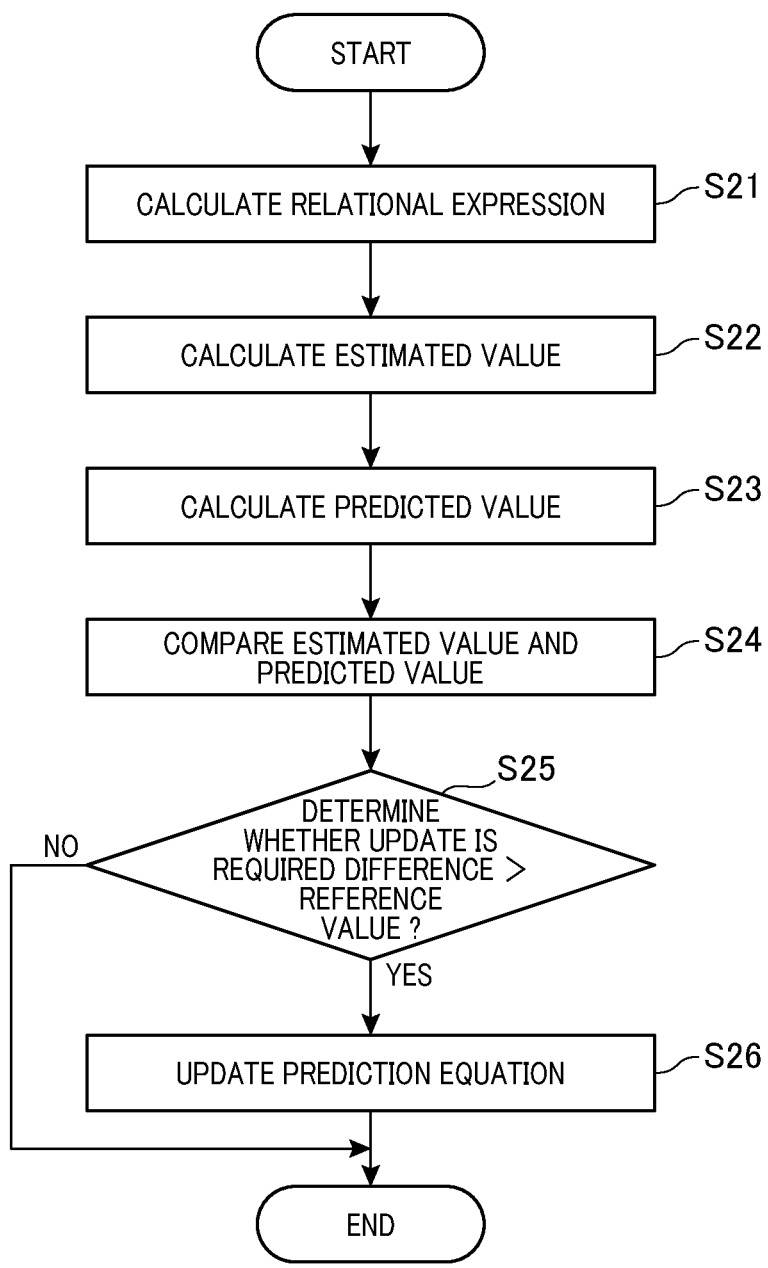
FIG. 9 is a flowchart for explaining the flow for updating a prediction equation according to a second embodiment.
Figure 10A:
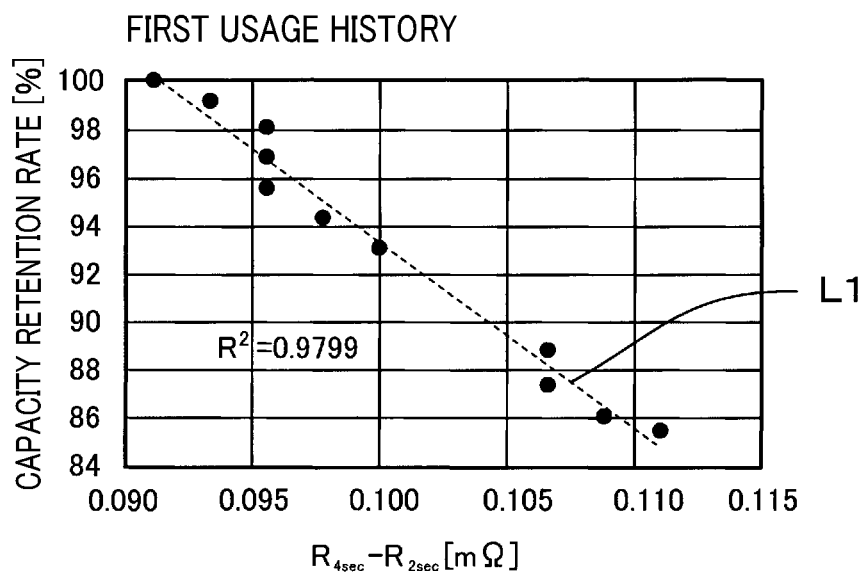
FIG. 10A is a conceptual diagram illustrating a relational expression between the difference in resistance and the capacity retention obtained from a first usage history.

First, in step S21 illustrated in FIG. 9, the learning unit 111, for example, acquires the difference $R_{4\ sec}-R_{2\ sec}$ in a deterioration process in which a charge/discharge cycle is repeated between 10% and 90% SOC at a battery temperature of 25° C. and the battery capacity $Q_B$ of the secondary battery 21 as the first usage history, and calculates a first relational expression by machine learning from the relation of both. The first relational expression is a regression line obtained based on the least-square method from the measured value of the relation between the difference $R_{4\ sec}-R_{2\ sec}$ and the capacity retention. FIG. 10A illustrates a scatter plot of measured values as the relation between the difference $R_{4\ sec}-R_{2\ sec}$ and the capacity retention in the first usage history, and the regression line, which is the first relational expression, is indicated by the broken line L1. Note that the capacity retention is the ratio of the battery capacity $Q_B$ at each point in time to the battery capacity of the secondary battery 21 in the initial state.

Figure 10B:
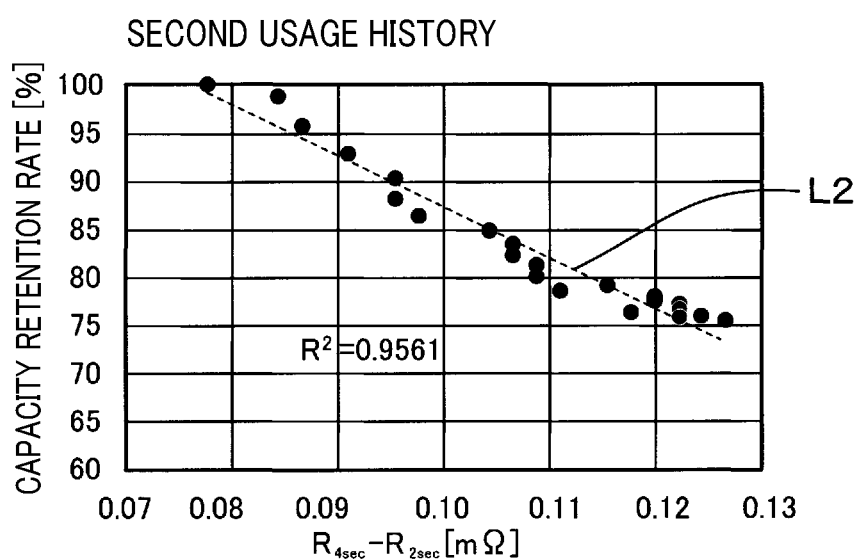
FIG. 10B is a conceptual diagram illustrating a relational expression between the difference in resistance and the capacity retention obtained from a second usage history according to the second embodiment.

Similarly, in step S21 illustrated in FIG. 9, the learning unit 111, for example, acquires the difference $R_{4\ sec}-R_{2\ sec}$ in a deterioration process in which a charge/discharge cycle is repeated between 0% and 100% SOC at a battery temperature of 45° C. and the capacity retention of the secondary battery 21 as the second usage history, and calculates a second relational expression by machine learning from the relation of both. Similar to the case of the first usage history, FIG. 10B illustrates a scatter plot of measured values as the relation between the difference $R_{4\ sec}-R_{2\ sec}$ and the capacity retention in the second usage history, and the regression line, which is the second relational expression, is indicated by the broken line L2.

After that, in step S22 illustrated in FIG. 9, the learning unit 111, for example, calculates the estimated value of the battery capacity $Q_B$ of the secondary battery 21 from the first relational expression calculated by machine learning based on the first usage history as a true value. Then, in step S23 illustrated in FIG. 9, the capacity prediction unit 110 calculates a predicted value of the battery capacity $Q_B$ of the secondary battery 21 based on the prediction equation illustrated in the Equations (7) to (11) or the Equations (7A) to (11A) described above.

Then, in step S24 illustrated in FIG. 9, the learning unit 111 compares the estimated value of the battery capacity $Q_B$ with the predicted value of the battery capacity $Q_B$, and then in step S25, based on the comparison result, determines whether it is necessary to update the prediction equation. In the second embodiment, whether updating is necessary is determined by determining whether the comparison result indicates that the difference between the estimated value and the predicted value is larger than a reference value. In step S25, in a case where it is determined that the comparison result indicates that the difference between the estimated value and the predicted value is larger than the reference value, it is determined that the prediction equation needs to be updated, and the process proceeds to YES in step S25.

Then, in step S26, the learning unit 111 updates at least one of the constants included in the prediction equation expressed by the Equation (7) to (11) or the Equations (7A) to (11A), and ends the update flow. Note that in the comparison between the estimated value and the predicted value in step S24 and in the determination of the necessity of updating in step S25, first, both the estimated value according to the first relational expression based on the usage history and second, the estimated value according to the second relational expression based on the usage history may be used, or only one of the values may be used.

On the other hand, in step S25 illustrated in FIG. 9, in a case where it is determined that the comparison result does not indicate that the difference between the estimated value and the predicted value is larger than the reference value, it is determined that updating the prediction equation is unnecessary, and the process proceeds to NO in step S25 to end the update flow. Note that the update flow in the second embodiment may be performed at any desired timing.

According to the second embodiment, the learning unit 111 may update the prediction equation by learning according to the deterioration state of the secondary battery 21 that constantly changes over time during use, and thus the prediction accuracy may be further improved. As a result, it is possible to provide a battery deterioration prediction system 1 capable of predicting the degree of deterioration of the secondary battery 21 with high accuracy. Note that the second embodiment also has the same effect as that of the first embodiment.

In the second embodiment, the voltage behavior at the end of charging in the secondary battery 21 is adopted as the state estimation amount obtained from the usage history; however, instead of this, in a first modification, the voltage relaxation behavior after the charging is stopped in the secondary battery 21 may be adopted. In first modification, as the voltage relaxation behavior after the charging is stopped, for example, the voltage change $\Delta V_{600\ sec}$ for 600 seconds after the charging of the secondary battery 21 is stopped is acquired by the voltage acquisition unit. Note that the period of voltage relaxation is the period from when charging is stopped until the battery voltage reaches a specified steady state.

Figure 11A:
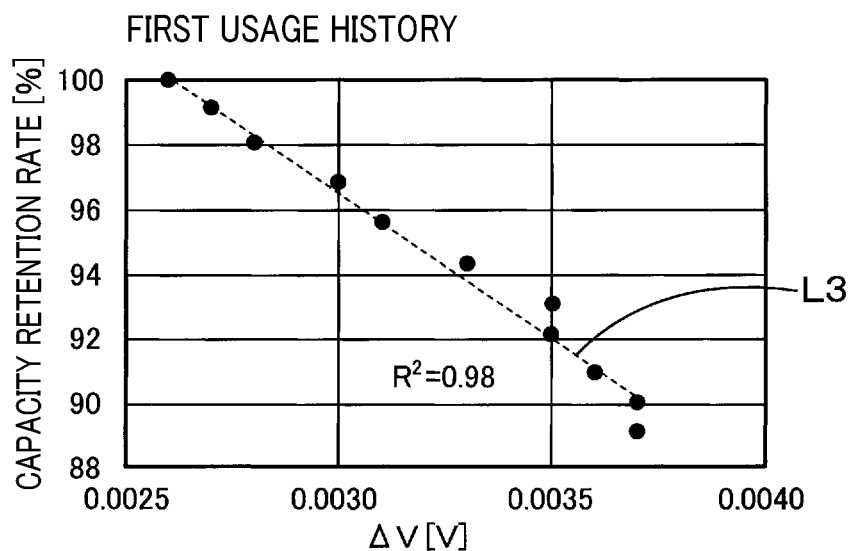
FIG. 11A is a conceptual diagram illustrating a relational expression between the difference in resistance and the capacity retention obtained from a first usage history.

Then, for example, the learning unit 111 acquires the voltage change $\Delta V_{600\ sec}$ and the battery capacity $Q_B$ in the deterioration process in which the charge/discharge cycle is repeated between 10% and 90% SOC at a battery temperature of the secondary battery 21 of 25° C. as the first usage history, and calculates the first relational expression by machine learning from the relation of both. The first relational expression is a regression line obtained from the measured value of the relation between the voltage change $\Delta V_{600\ sec}$ and the battery capacity $Q_B$ based on the least-square method. FIG. 11A illustrates a scatter diagram of the measured values which is the relation between the voltage change $\Delta V_{600\ sec}$ and the capacity retention in the first usage history, and a regression line, which is the first relational expression, is illustrated by the broken line L3.

Figure 11B:
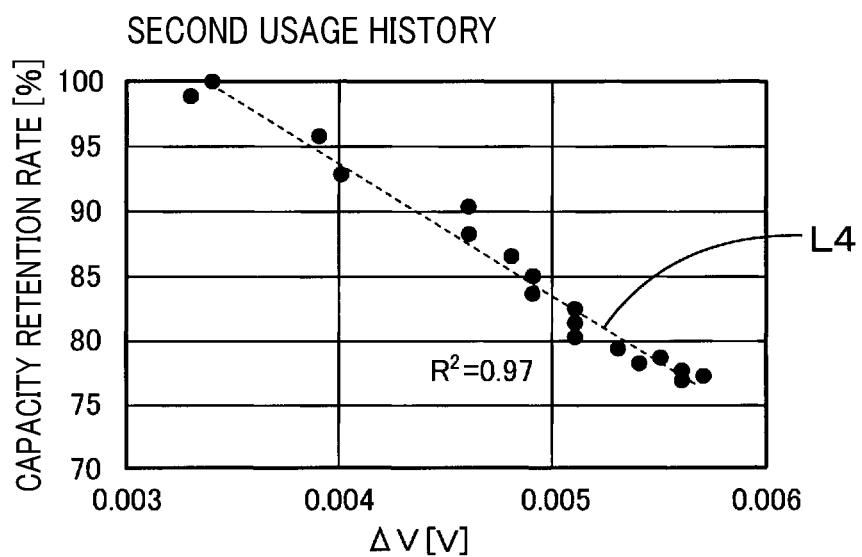
FIG. 11B is a conceptual diagram illustrating a relational expression between the difference in resistance and the capacity retention obtained from a second usage history based on voltage relaxation behavior after a charging pause according to the second embodiment.

Then, similarly, the learning unit 111, for example, calculates the second relational expression by machine learning based on the relation between the voltage change $\Delta V_{600\ sec}$ and the battery capacity $Q_B$ in the deterioration process in which the charge/discharge cycle is repeated between 0% and 100% SOC at a battery temperature of the secondary battery 21 of 45° C. as the second usage history. Similar to the case of the first usage history, FIG. 11B illustrates a scatter plot of measured values as the relation between the voltage change $\Delta V_{600\ sec}$ and the capacity retention in the second usage history, and the regression line, which is the second relational expression, is indicated by the broken line L4. Then, also in first modification, the same operational effect as in the second embodiment may be obtained.

Moreover, in a second modification as a further modified form, the AC impedance of a specific frequency in the secondary battery 21 is adopted as the state estimation amount obtained from the usage history. Note that in this second modification, the secondary battery 21 uses LiNiCoMnO$_2$ (NCM) as the positive electrode material and graphite (Gr) as the negative electrode material. Note that the AC impedance of a specific frequency may be calculated by an AC impedance calculation unit (not illustrated) mounted in the vehicle. In this modification, the AC impedance calculation unit calculates the AC impedance of a specific frequency based on the change in the electrical current value and the change in the voltage value in the secondary battery 21 during charging/discharging. Note that the specific frequency may be set as appropriate, and the value of the specific frequency is not limited.

Figure 12A:
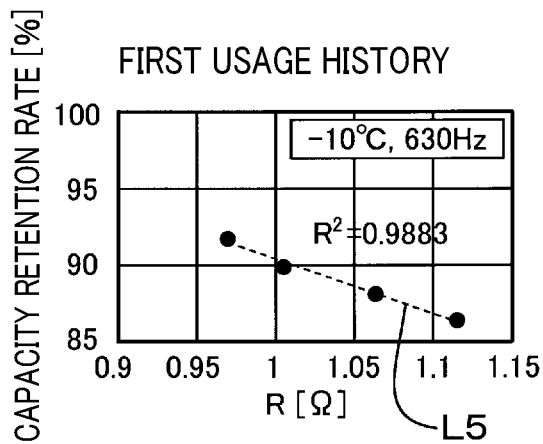
FIGS. 12A and 12B are conceptual diagrams illustrating the relational expression between the AC impedance and capacity retention of a specific frequency obtained from a first usage history.
Figure 12B:
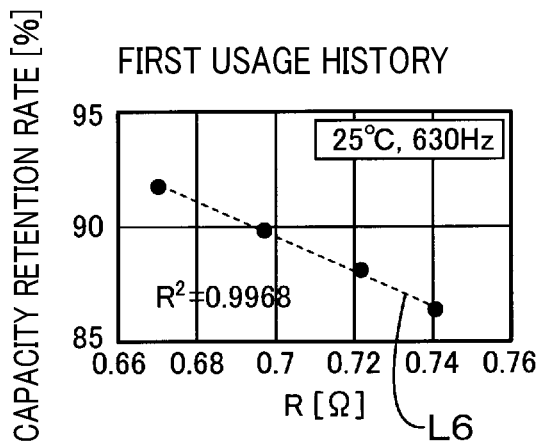

In second modification, for example, the learning unit 111 calculates a first relational expression by machine learning based on the relation between the AC impedance at a frequency of 630 Hz and the battery capacity $Q_B$ at a battery temperature of −10° C. in the deterioration process after the secondary battery 21 has been stored at a battery temperature of 60° C. at an SOC of 90% as a first usage history. Moreover, the learning unit 11 calculates a second relational expression by machine learning based on the relation between the AC impedance at a frequency of 630 Hz and the battery capacity $Q_B$ under the condition of a battery temperature of 25° C. The first relational expression and the second relational expression are regression lines obtained from the measured values of the relation between the AC impedance and the battery capacity $Q_B$ based on the least-square method. FIG. 12A illustrates a scatter diagram of the measured values which is the relation between the AC impedance and the capacity retention under the condition of a battery temperature of −10° C. in the first usage history, and the regression line, which is the first relational expression, is indicated by a broken line L5. Moreover, FIG. 12B illustrates a scatter diagram of the measured values which is the relation between the AC impedance and the capacity retention under the condition of a battery temperature of 25° C. in the first usage history, and the regression line, which is the second relational expression, is indicated by a broken line L6.

Figure 12C:
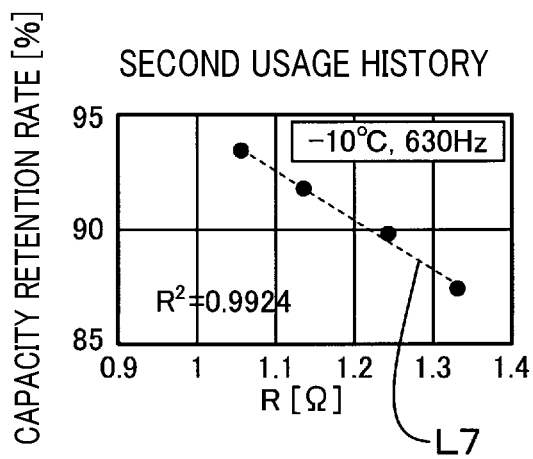
FIGS. 12C and 12D are conceptual diagrams illustrating the relational expression between the AC impedance and capacity retention of a specific frequency obtained from a second usage history according to the second embodiment.
Figure 12D:
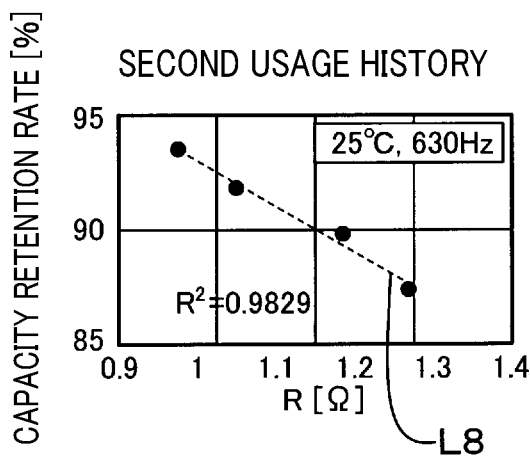

In addition, similarly, in second modification, the learning unit 111, for example, calculates a third relational expression by machine learning based on the relation between the AC impedance at a frequency of 630 Hz and the battery capacity $Q_B$ at a battery temperature of −10° C. in the deterioration process after the secondary battery 21 has been stored at a battery temperature of 55° C. at an SOC of 100% as a second usage history. Furthermore, the learning unit 111 calculates a fourth relational expression by machine learning based on the relation between the AC impedance at a frequency of 630 Hz and the battery capacity $Q_B$ under the condition of a battery temperature of 25° C. The third relational expression and the fourth relational expression are regression lines obtained from the measured values of the relation between the AC impedance and the battery capacity $Q_B$ based on the least-square method. FIG. 12C illustrates a scatter diagram of the measured values which is the relation between the AC impedance and the capacity retention under the condition of a battery temperature of −10° C. in the second usage history, and the regression line, which is the third relational expression, is indicated by a broken line L7. Moreover, FIG. 12D illustrates a scatter diagram of the measured values which is the relation between the AC impedance and the capacity retention under the condition of a battery temperature of 25° C. in the second usage history, and the regression line, which is the fourth relational expression, is indicated by a broken line L8. Also, in second modification, the same operational effect as in the second embodiment may be obtained.

Moreover, in a third modification as a further modified form, as in Second modification, the AC impedance at a specific frequency in the secondary battery 21 is adopted as the state estimation amount obtained from the usage history. Then, in third modification, the learning unit 111, for example, calculates a first relational expression by machine learning based on the relation between the AC impedance at a frequency of 630 Hz and the battery capacity $Q_B$ at a battery temperature of −10° C. in the deterioration process of repeating the charging/discharging cycle between SOC 0% to 100% at a battery temperature of 45° C. of the secondary battery 21 as a first usage history. Moreover, the learning unit 111 calculates a second relational expression by machine learning based on the relation between the AC impedance at a frequency of 630 Hz and the battery capacity $Q_B$ under the condition of a battery temperature of 25° C.

Figure 13A:
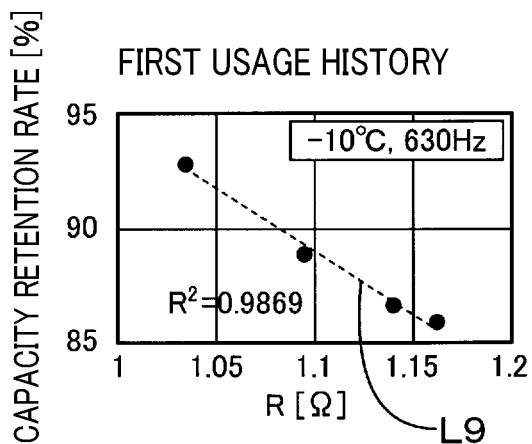
FIGS. 13A and 13B are conceptual diagrams illustrating a relational expression between the AC impedance and capacity retention of a specific frequency obtained from a first usage history.
Figure 13B:
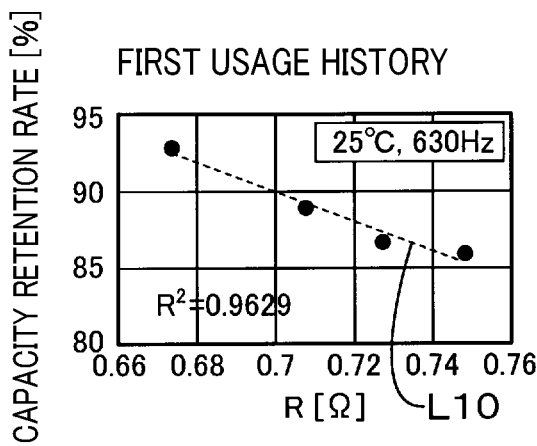

The first relational expression and the second relational expression are regression lines obtained from the measured values of the relation between the AC impedance and the battery capacity $Q_B$ based on the least-square method. FIG. 13A illustrates a scatter diagram of the measured values which is the relation between the AC impedance and the capacity retention under the condition of a battery temperature of −10° C. in the first usage history, and the regression line, which is the first relational expression, is indicated by a broken line L9. Moreover, FIG. 13B illustrates a scatter diagram of the measured values which is the relation between the AC impedance and the capacity retention under the condition of a battery temperature of 25° C. in the first usage history, and the regression line, which is the second relational expression, is indicated by a broken line L10.

Figure 13C:
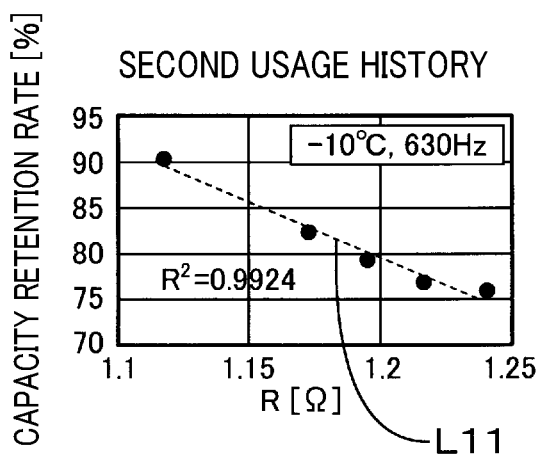
FIGS. 13C and 13D are conceptual diagrams illustrating a relational expression between the AC impedance and capacity retention of a specific frequency obtained from a second usage history according to a third embodiment.
Figure 13D:
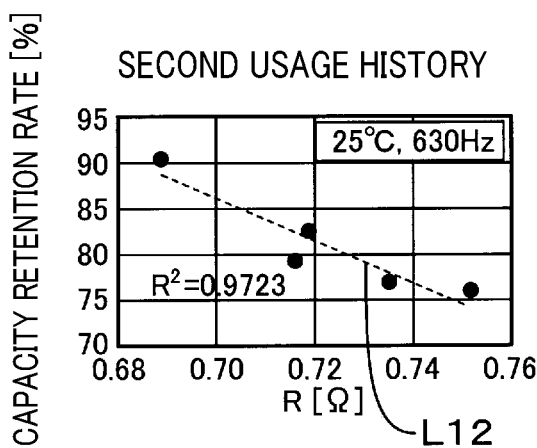

In addition, similarly, the learning unit 111, for example, calculates a third relational expression by machine learning based on the relation between the AC impedance at a frequency of 630 Hz and the battery capacity $Q_B$ at a battery temperature of −10° C. in the deterioration process after the secondary battery 21 has been stored at a battery temperature of 55° C. at an SOC 100% as a second usage history. Furthermore, the learning unit 111 calculates a fourth relational expression by machine learning based on the relation between the AC impedance at a frequency of 630 Hz and the battery capacity $Q_B$ under the condition of a battery temperature of 25° C. The third relational expression and the fourth relational expression are regression lines obtained from the measured values of the relation between the AC impedance and the battery capacity $Q_B$ based on the least-square method. FIG. 13C illustrates a scatter diagram of the measured values which is the relation between the AC impedance and the capacity retention under the condition of a battery temperature of −10° C. in the second usage history, and the regression line, which is the third relational expression, is indicated by a broken line L11. Moreover, FIG. 13D illustrates a scatter diagram of the measured values which is the relation between the AC impedance and the capacity retention under the condition of a battery temperature of 25° C. in the second usage history, and the regression line, which is the fourth relational expression, is indicated by a broken line L12. In Third modification as well, the same operational effect as in the second embodiment may be obtained.

Moreover, in Modification 4 as a further modified form, as in Modifications 2 and 3, the AC impedance at a specific frequency in the secondary battery 21 is adopted as the state estimation amount obtained from the usage history. Then, in Modification 4, the learning unit 111, for example, calculates a first relational expression by machine learning based on the relation between the AC impedance at a frequency of 630 Hz and the battery capacity $Q_B$ at a battery temperature of −10° C. in the deterioration process of repeating the charging/discharging cycle between SOC 10% to 90% at a battery temperature of 10° C. of the secondary battery 21 as a first usage history. In addition, the learning unit 111 calculates a second relational expression by machine learning based on the relation between the AC impedance at a frequency of 0.005 Hz and the battery capacity $Q_B$ under the condition of a battery temperature of 25° C. Furthermore, the learning unit 111 calculates a third relational expression by machine learning based on the relation between the AC impedance at a frequency of 50 Hz and the battery capacity $Q_B$ under the condition of a battery temperature of −10° C.

Figure 14A:
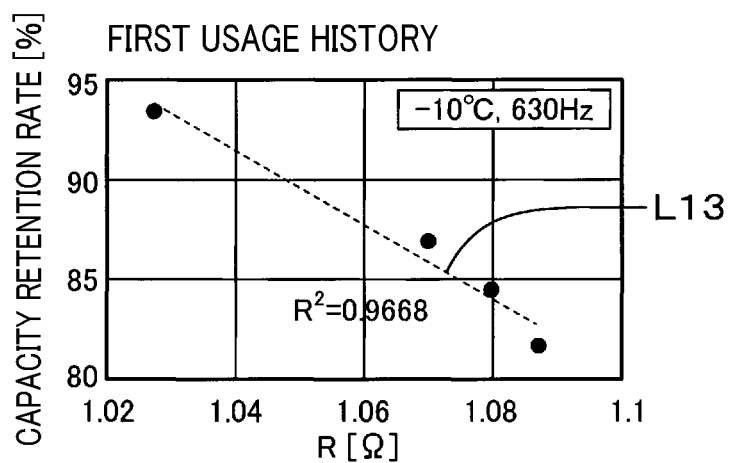
FIGS. 14A, 14B and 14C are conceptual diagrams illustrating a relational expression between the AC impedance and capacity retention of a specific frequency obtained from a first usage history according to a fourth embodiment.
Figure 14B:
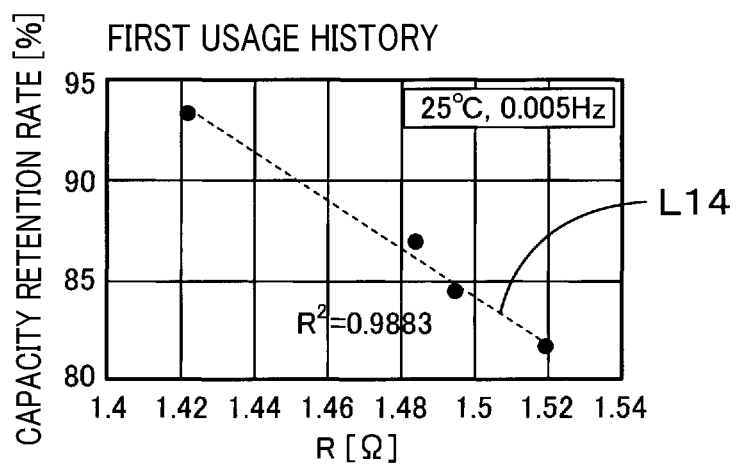
Figure 14C:
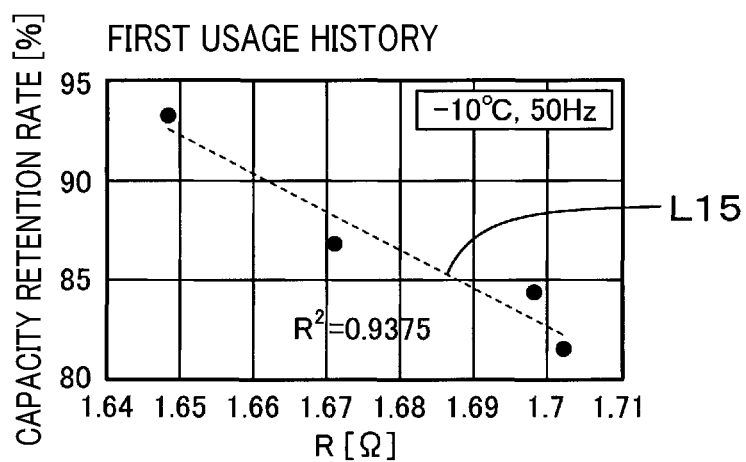

The first relational expression, the second relational expression and the third relational expression are regression lines obtained from the measured values of the relation between the AC impedance and the battery capacity $Q_B$ based on the least-square method. FIG. 14A illustrates a scatter diagram of the measured values which is the relation between the AC impedance at a frequency of 630 Hz and the capacity retention under the condition of a battery temperature of −10° C. in the first usage history, and the regression line, which is the first relational expression, is indicated by a broken line L13. FIG. 14B illustrates a scatter diagram of the measured values which is the relation between the AC impedance at a frequency of 0.005 Hz and the capacity retention under the condition of a battery temperature of 25° C. in the first usage history, and the regression line, which is the second relational expression, is indicated by a broken line L14. FIG. 14C illustrates a scatter diagram of the measured values which is the relation between the AC impedance at a frequency of 50 Hz and the capacity retention under the condition of a battery temperature of −10° C. in the first usage history, and the regression line, which is the third relational expression, is indicated by a broken line L15. In modification 4 as well, the same operational effect as in the second embodiment may be obtained.

Third Embodiment

Figure 15:
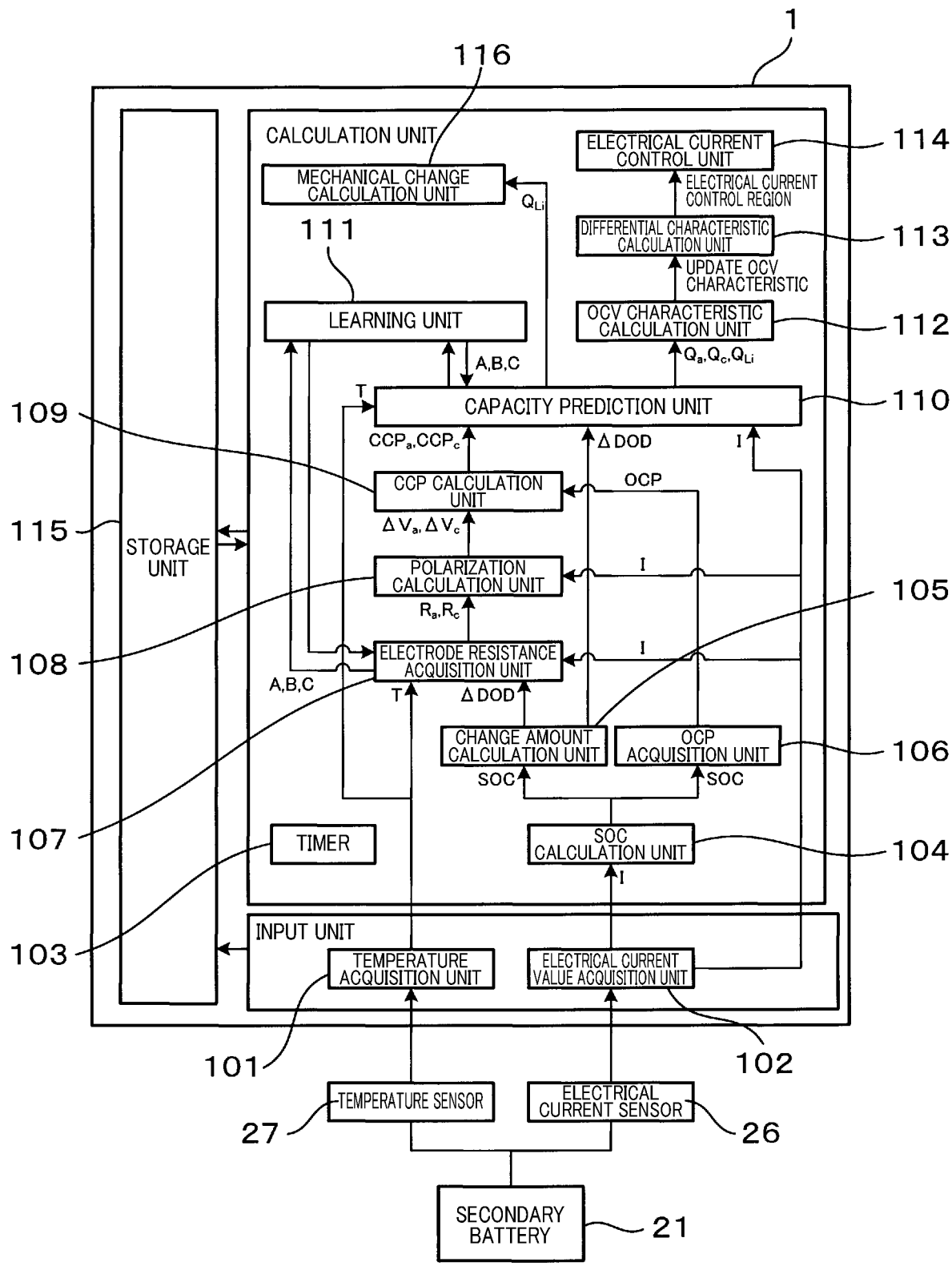
FIG. 15 is a functional block diagram illustrating a configuration of a battery deterioration prediction system according to the third embodiment.

As illustrated in FIG. 15, in the battery deterioration prediction system 1 of a third embodiment, in addition to the configuration of the first embodiment described above, there is a mechanical change calculation unit 116. The mechanical change calculation unit 116 calculates the relational value regarding the mechanical change of the secondary battery 21 based on the positive/negative electrode SOC capacity deviation $Q_{Li}$ predicted by the capacity prediction unit 110. The mechanical change calculation unit 116 includes, for example, a vehicle-mounted BMU, and includes a processor capable of executing a program for calculating a relational value regarding the mechanical change of the secondary battery 21.

In this third embodiment, examples of mechanical change of the secondary battery 21 may include the change of the cell thickness, the change of the volume, and the change of the spring constant in the secondary battery 21. The mechanical change of the secondary battery 21 is caused by the expansion of the negative electrode and the positive electrode of the secondary battery 21. The expansion of both electrodes is caused by a coating film formed on both electrodes. The coating film is formed by consuming an electrolytic solution including lithium ions in the battery reaction system. On the other hand, the positive/negative electrode SOC capacity deviation $Q_{Li}$ depends on the number of lithium ions that may move between the positive electrode and the negative electrode. Therefore, it is possible to calculate a relational value relating to the mechanical change of the secondary battery 21 due to the formation of the coating film based on the predicted value of the positive/negative electrode SOC capacity deviation $Q_{Li}$. The relational value relating to the mechanical change of the secondary battery 21 may be the amount of change in the cell thickness, the amount of expansion, and the amount of change in the spring constant in the secondary battery 21.

In this third embodiment, by the mechanical change calculation unit 116 calculating the relational value relating to the mechanical change of the secondary battery 21, it is possible to predict sudden deterioration due to liquid shortage or breakage of the current collector in the secondary battery 21, and it is possible to predict lithium precipitation caused by high-rate deterioration due to charging at a high C rate. As a result, the reliability of the secondary battery 21 may be diagnosed from a structural aspect. It should be noted that in the third embodiment as well, the same operational effect as that of the first embodiment described above may be obtained.

Note that the mechanical change calculation unit 116 may also predict the gas generation in the secondary battery 21 as the mechanical change in the secondary battery 21. The gas generation in the secondary battery 21 is caused by redox decomposition of the electrolytic solution of the secondary battery 21, and the redox decomposition of the electrolytic solution consumes lithium ions in the battery reaction system. Therefore, as in the case of forming the coating film described above, the amount of gas generated may be calculated as a relational value related to the mechanical change of the secondary battery 21 based on the predicted value of the positive/negative electrode SOC capacity deviation Qu.

Fourth Embodiment

Figure 16:
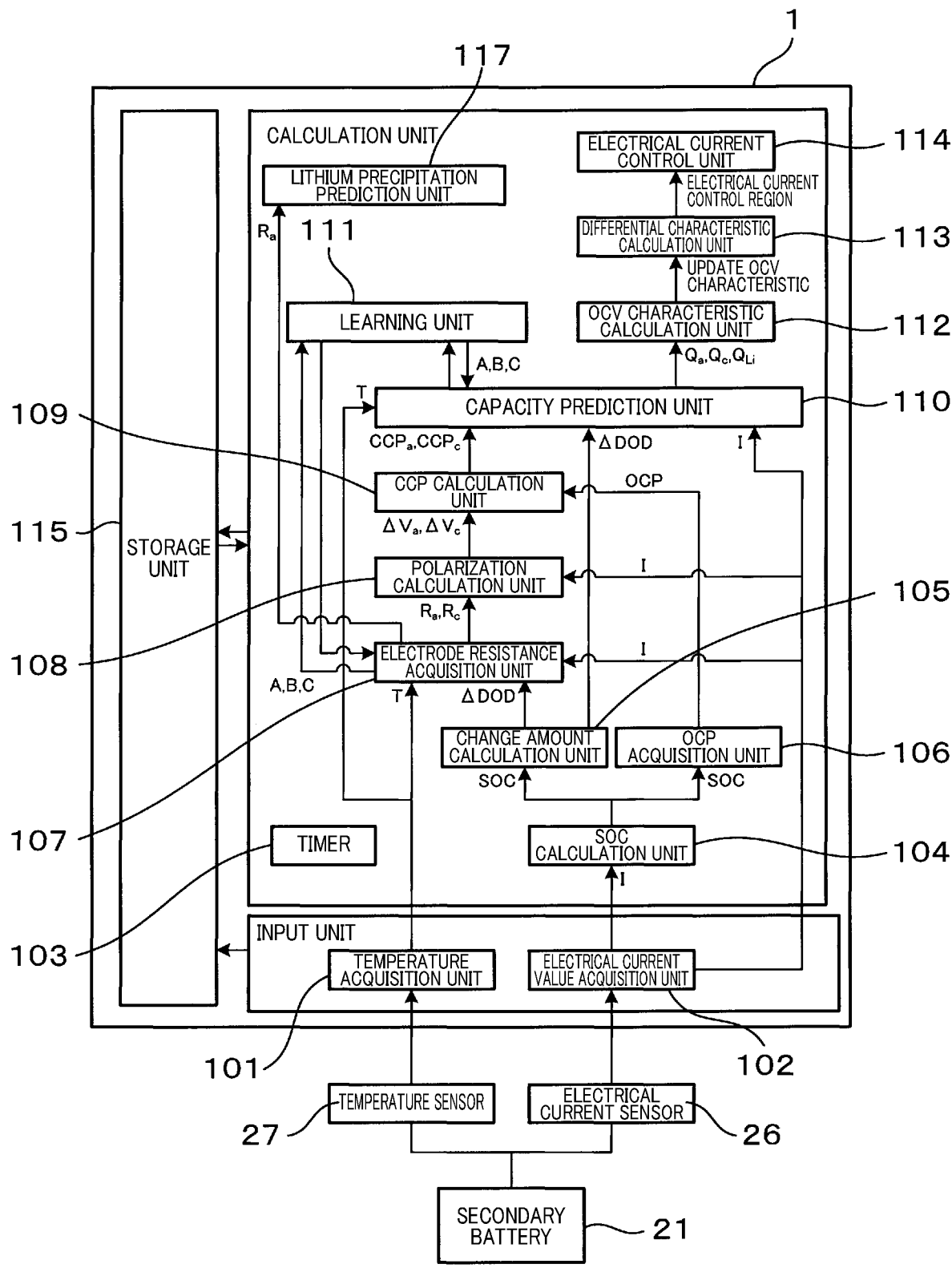
FIG. 16 is a functional block diagram illustrating a configuration of a battery deterioration prediction system according to the fourth embodiment.

The battery deterioration prediction system 1 of the fourth embodiment has a lithium precipitation prediction unit 117 as illustrated in FIG. 16 instead of the mechanical change calculation unit 116 in the third embodiment described above. The lithium precipitation prediction unit 117 predicts the timing of lithium precipitation that occurs in the negative electrode of the secondary battery 21 based on the negative electrode resistance $R_a$ calculated by the electrode resistance acquisition unit 107. The lithium precipitation prediction unit 117 compares the negative electrode resistance $R_a$ with the preset reference voltage for lithium precipitation, and at the timing when the comparison result indicates that the negative electrode resistance $R_a$ is lower than the reference voltage, is able to predict that lithium precipitation will start to precipitate on the negative electrode of the secondary battery 21.

In this fourth embodiment, the accuracy of the deterioration prediction of the secondary battery 21 may be further improved by predicting the timing of lithium precipitation by the lithium precipitation prediction unit 117. Note that in the fourth embodiment as well, the same operational effect as that of the first embodiment described above may be obtained.

Fifth Embodiment

In the first embodiment described above, a form is described in which the entire configuration of the secondary battery 21, the electrical current sensor 26, the temperature sensor 27, and the battery deterioration prediction system 1 is mounted in a vehicle, and as another form, a form is described in which only the learning unit 111 is arranged outside the vehicle and the configuration other than the learning unit 111 is mounted in the vehicle. Not being limited to this, configuration is also possible in which the secondary battery 21 may be mounted in the vehicle, and at least a part of the battery deterioration prediction system 1 may be arranged outside the vehicle. For example, in the fifth embodiment illustrated in FIG. 17, configuration is such that the secondary battery 21, the electrical current sensor 26, and the temperature sensor 27 are mounted in the vehicle 50, and the entire configuration of the battery deterioration prediction system 1 is arranged outside the vehicle 50.

In the fifth embodiment, the battery deterioration prediction system 1 is arranged on the server 60 arranged outside the vehicle 50. The server 60 may be configured by a computer. Note that the server 60 may be configured by a single computer, or may be configured by a network in which a plurality of computers are connected by wire or wirelessly. Moreover, the server 60 may form a cloud server via the Internet.

Figure 17:
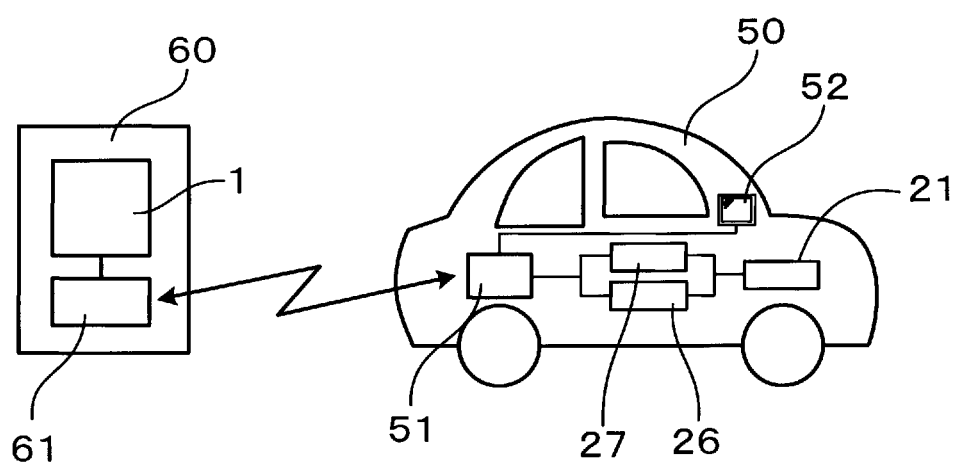
FIG. 17 is a conceptual diagram illustrating a battery deterioration prediction system and a vehicle according to a fifth embodiment.

As illustrated in FIG. 17, in the fourth embodiment, the vehicle 50 has a wireless communication unit 51, and the server 60 also has a wireless communication unit 61. Then, the electrical current value and the battery temperature of the secondary battery 21 detected by the electrical current sensor 26 and the temperature sensor 27 in the vehicle 50 may be transmitted to the battery deterioration prediction system 1 on the server 60 via both wireless communication units 51 and 61.

Moreover, in the fifth embodiment, as illustrated in FIG. 17, the vehicle 50 may include a display unit 52 that displays the prediction result by the battery deterioration prediction system 1. The prediction result by the battery deterioration prediction system 1 may be transmitted from the battery deterioration prediction system 1 on the server 60 to the vehicle 50 via the wireless communication units 51 and 61 and displayed on the display unit 52 of the vehicle 50. As a result, the prediction result by the battery deterioration prediction system 1 may be checked in the vehicle.

In the fifth embodiment, it is not necessary to mount the configuration of the battery deterioration prediction system 1 in the vehicle 50, and thus it is possible to prevent the configuration of the BMU of the vehicle 50 from becoming complicated. Moreover, since the battery deterioration prediction system 1 is arranged on the server 60 arranged on the outside of the vehicle, the management of the battery deterioration prediction system 1 becomes easy. Furthermore, when the battery deterioration prediction systems 1 of a plurality of vehicles are arranged on the server 60, the workability is improved by managing these collectively. Note that in the fifth embodiment as well, the same operational effect as that of the first embodiment described above may be obtained.

Sixth Embodiment

Figure 18:
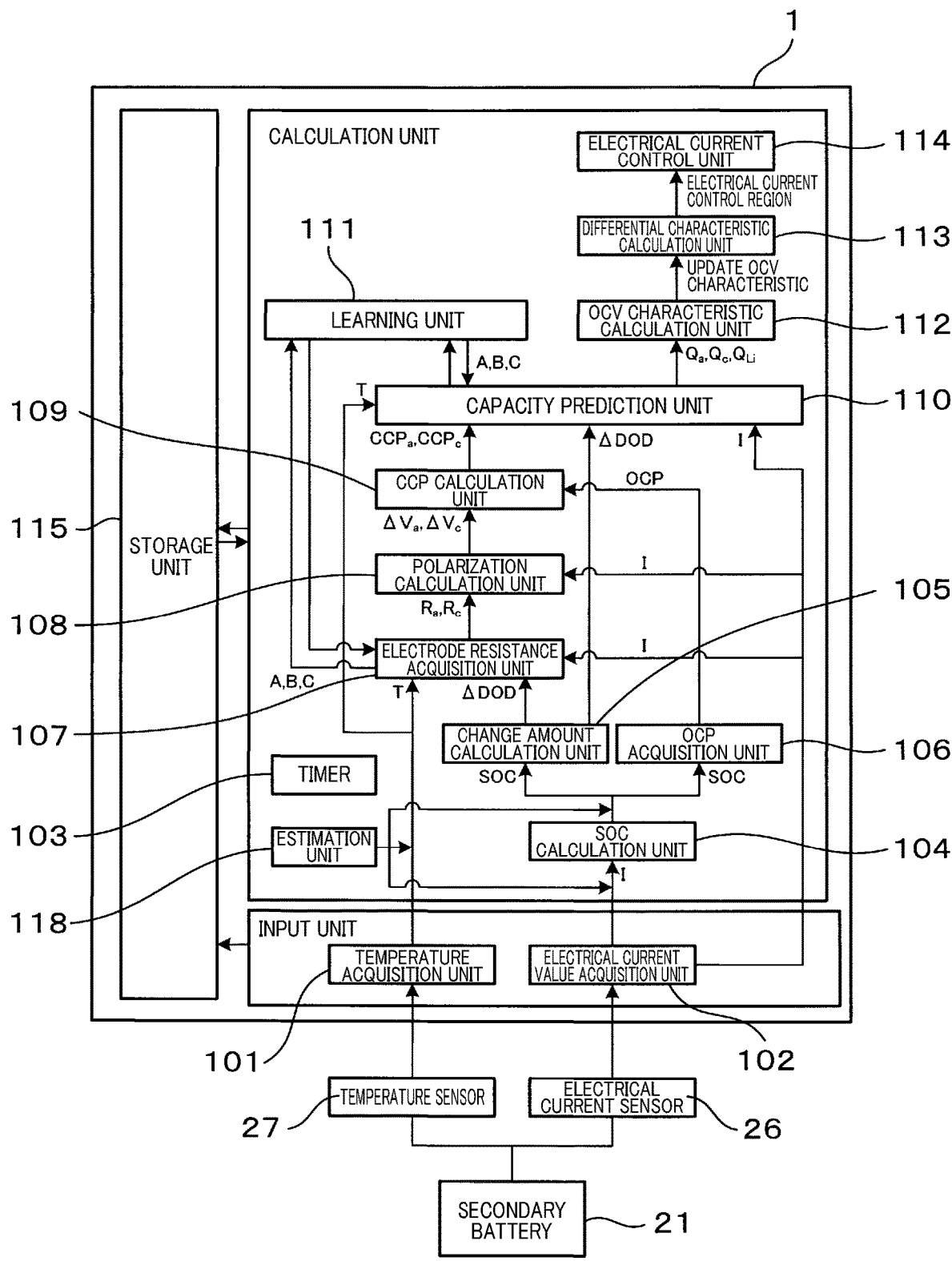
FIG. 18 is a functional block diagram illustrating a configuration of a battery deterioration prediction system according to a sixth embodiment.

In the sixth embodiment, as illustrated in FIG. 18, the battery deterioration prediction system 1 has an estimation unit 118 that estimates the data that could not be acquired in a data non-acquisition period $\Delta tN$ in which data required for acquiring values of variables included in the plurality of functions $g_A$, $g_B$, $g_C$, $h_A$, $h_B$, $h_C$, $i_A$, $i_B$, $i_C$, $j_A$, $j_B$, $j_C$, $k_A$, $k_B$, $k_C$, $l_A$, $l_B$, $l_C$ could not be acquired. Then, the electrode resistance acquisition unit 107 and the capacity prediction unit 110 calculate the negative electrode resistance $R_a$, the positive electrode resistance $R_c$, the negative electrode capacity $Q_a$, the positive electrode capacity $Q_c$, and the positive/negative electrode SOC capacity deviation $Q_{Li}$ in the data non-acquisition period by using the variables acquired based on the data above estimated by the estimation unit 118. In the sixth embodiment, the same components as those in the first embodiment are designated by the same reference numerals, and the description thereof will be omitted.

In the sixth embodiment, the data required for acquiring the values of the above variables may be, for example, battery information such as temperature T, current value I, voltage value V, SOC and the like in the secondary battery 21, or the data may be the variable itself in the function, or the values of the variables may be calculated based on the data.

Moreover, the estimation unit 118 illustrated in FIG. 18 is composed of an arithmetic unit that executes a program for performing the above estimation, and in the sixth embodiment, is composed of a BMU mounted in a vehicle. In the sixth embodiment, the data non-acquisition period is, for example, a period during which the data cannot be acquired due to power not being supplied to the battery deterioration prediction system 1, or is a period during which the data cannot be acquired due to a failure or the like in the battery deterioration prediction system 1. In the sixth embodiment, the secondary battery 21 constitutes a battery mounted on a vehicle, the battery deterioration prediction system 1 is composed of a BMU, and the period during parking when the ignition of the vehicle is OFF corresponds to the data non-acquisition period.

In the sixth embodiment, the estimation unit 118 estimates the temperature T, the electrical current value I, the voltage value V, and the SOC of the secondary battery 21 during the data non-acquisition period $\Delta tN$. These estimation processes by the estimation unit 118 are performed before step S1 of the process of predicting the battery capacity $Q_B$ by the battery deterioration prediction system 1 illustrated in FIG. 3. After the estimation process is completed, the process of predicting the battery capacity $Q_B$ is performed using the value estimated by the estimation process.

Next, the estimation process in the sixth embodiment will be described with reference to the flowchart illustrated in FIG. 19.

Figure 20A:
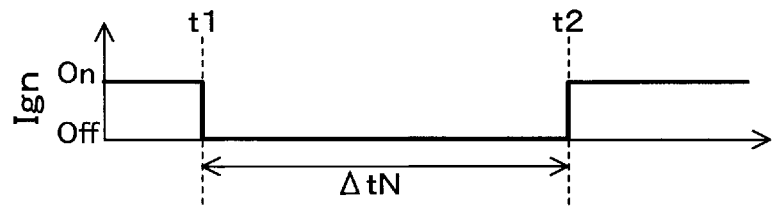
FIGS. 20A to 20E are conceptual diagrams illustrating change in the ignition, the temperature, the electrical current value, the voltage value, and SOC data non-acquisition period, respectively.

First, in step S101 illustrated in FIG. 19, the estimation unit 118 determines whether the vehicle has an unprocessed parking period in the usage history. In the present embodiment, the estimation unit 118 determines whether the vehicle has a period as illustrated in FIG. 20A when the vehicle ignition Ign is OFF. As illustrated in FIG. 20A, in a case where it is determined that there is a parking period $\Delta tN$ in which Ign was OFF, the process proceeds to YES in step S101, otherwise, the process proceeds to NO in step S101 to end the estimation process.

Next, in a case where the process proceeds to YES in step S101 illustrated in FIG. 19, the estimation unit 118 reads the data immediately before the start of parking and the data immediately after the end of parking. The data immediately before the start of parking are the temperature T1, the electrical current value I1, the voltage value V1 and the SOC1 at the timing immediately before the start timing t1 of the parking period $\Delta tN$ illustrated in FIGS. 20A to 20E. Moreover, the data immediately after the end of parking are the temperature T2, the electrical current value I2, the voltage value V2, and the SOC2 at the timing immediately after the end timing t2 of the parking period $\Delta tN$ illustrated in FIGS. 20A to 20E. All of these data are stored in the storage unit 115.

After that, in step S103 illustrated in FIG. 19, the estimation unit 118 acquires the ambient temperature Ts of the secondary battery 21 during the parking period $\Delta tN$. The ambient temperature Ts of the secondary battery 21 is not the temperature of the secondary battery 21 itself, but is the temperature of the surroundings where the secondary battery 21 is arranged. When another device that operates during the parking period $\Delta tN$ is arranged around the secondary battery 21, the temperature detected by the temperature sensor mounted in the other device may be adopted as the ambient temperature Ts. Moreover, in a case where it is difficult to obtain the ambient temperature with the temperature sensor mounted in the other device, it is possible to refer to weather data provided by a Japan Meteorological Agency, or the like, and use the outside air temperature at the place and time when the vehicle was parked during the parking period $\Delta tN$ as ambient temperature of the secondary battery 21. In the sixth embodiment, the ambient temperature Ts of the secondary battery 21 is the temperature acquired by the temperature sensor mounted in a device provided around the secondary battery 21, and is the ambient temperature Ts illustrated in FIG. 20B may be expressed.

Then, the process proceeds to step S104 illustrated in FIG. 19, and the estimation unit 118 tentatively estimates the battery temperature during parking. In the tentative estimation, the outside air heat dissipation resistance with respect to the ambient temperature in the secondary battery 21 is acquired in advance, and estimation is performed by estimating the temperature change in the outside air environment of the ambient temperature Ts from the temperature T1 at the start timing t1 of the parking period ΔtN to the end timing t2 of the parking period ΔtN. For example, the tentative estimation value by the estimation unit 118 may be expressed as the tentative estimation temperature Ta illustrated in FIG. 20B.

Figure 20B:
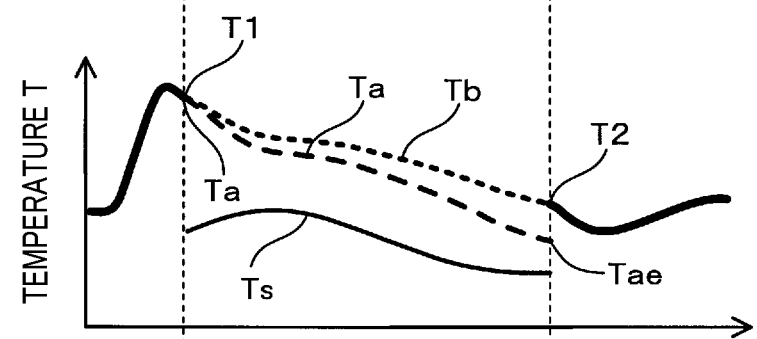

After that, the process proceeds to step S105 illustrated in FIG. 19, and the estimation unit 118 performs correction of the tentatively estimated temperature, and the corrected temperature is then calculated as the estimated temperature. This correction is performed so that the temperature Ta of the tentatively estimated temperature Ta at the start timing t1 of the parking period ΔtN coincides with the temperature T1 immediately before parking, and so that the temperature Tae of the tentatively estimated temperature Ta at the end timing t2 of the parking period ΔtN coincides with the temperature T2 immediately after parking. In the sixth embodiment, time-proportional correction is performed as the correction. In other words, as illustrated in FIG. 20B, the tentatively estimated temperature Tae at the end timing t2 of the parking period ΔtN and the temperature T2 of the secondary battery 21 at the end timing t2 of the parking period ΔtN are compared. Then, in a case where the two values are different, in a state where the tentatively estimated temperature Tae and the temperature T1 at the start timing t1 coincide, the estimated temperature Tb after correction is calculated by reducing the entire tentative estimated temperature Ta in the vertical direction of the graph so that the tentative estimated temperature Tae coincides with the temperature T2. Then, the calculated estimated temperature Tb after correction is stored in the storage unit 115. Note that the correction is not limited to this as long as the tentatively estimated temperature Tae is corrected to coincide with the temperature T2, and may be performed by other methods.

Figure 20C:
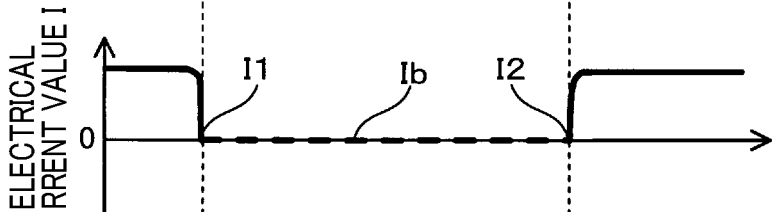
Figure 20D:
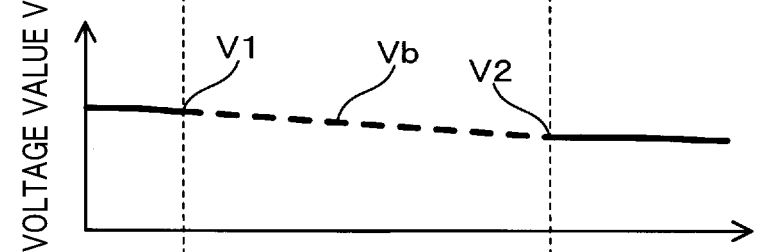
Figure 20E:
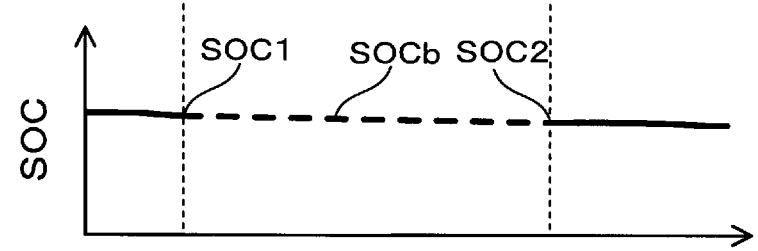

Next, the process proceeds to step S106 illustrated in FIG. 19, and the electrical current value I, the voltage value V, and the SOC during the parking period ΔtN are estimated by the estimation unit 118. First, no current is substantially flowing through the secondary battery 21 during the parking period ΔtN, and thus the estimated current value Ib, which is an estimated value of the electrical current value I, is estimated to be 0 A as illustrated in FIG. 20C. Moreover, the change in the voltage value V is small during the parking period ΔtN, and therefore the estimated voltage value Vb is linearly interpolated from the voltage value V1 immediately before the start of parking to the voltage value V2 immediately after the end of parking as illustrated in FIG. 20D. Moreover, the change in SIC is small during the parking period ΔtN, and therefore the estimated SOC value SOCb is linearly interpolated from SOC1 immediately before the start of parking to SOC2 immediately after the end of parking as illustrated in FIG. 20E. Then, the estimated current value Ib, the estimated voltage value Vb, and the estimated SOC value SOCb are also stored in the storage unit 115. Note that the method for estimating the estimated current value Ib, the estimated voltage value Vb, and the estimated SOC value SOCb is not limited to this, and other methods may also be used. Then, the flow of the estimation process ends, and the process proceeds to step S1 of the process of predicting the battery capacity $Q_B$ illustrated in FIG. 2.

With this sixth embodiment, it is possible to calculate the negative electrode resistance $R_a$, the positive electrode resistance $R_c$, the negative electrode capacity $Q_a$, the positive electrode capacity $Q_c$ and the positive/negative electrode SOC capacity deviation $Q_{Li}$ by using the estimated temperature value Tb, the estimated current value Ib, the estimated voltage value Vb and the estimated SOC value SOCb during a period in which it is not possible to acquire variables included in a plurality of functions for calculating the negative electrode resistance $R_a$, the positive electrode resistance $R_c$, the negative electrode capacity $Q_a$, the positive electrode capacity $Q_c$ and the positive/negative electrode SOC capacity deviation $Q_{Li}$ in a process for predicting the battery capacity $Q_B$. As a result, the prediction accuracy of the battery capacity $Q_B$ may be further improved.

Furthermore, in the sixth embodiment, the estimated temperature value Tb is calculated by correcting the tentatively estimated temperature Ta based on the outside air heat dissipation resistance in the secondary battery 21 by using the ambient temperature Ts. Therefore, the estimated temperature value Tb reflects the parking situation of the vehicle more highly, and the prediction accuracy of the battery capacity $Q_B$ may be further improved.

The present invention is not limited to each of the above-described embodiments and modifications, and may also be applied to various embodiments without departing from the gist thereof. For example, the mechanical change calculation unit 116 in the third embodiment and the lithium precipitation prediction unit 117 in the fourth embodiment may be combined.

What is claimed is:

1. A battery deterioration prediction system comprising:
a temperature sensor configured to measure a temperature of a secondary battery;
an electrical current sensor configured to measure an electrical current flowing through the secondary battery;
an electrode resistance acquisition unit that acquires a negative electrode resistance and a positive electrode resistance of the secondary battery, based on at least output from the temperature sensor;
an electrical current value acquisition unit that acquires an electrical current value of the secondary battery, based on output from the electrical current sensor;
an OCP acquisition unit that acquires an open circuit potential of the negative electrode of the secondary battery and an open circuit potential of the positive electrode of the secondary battery;
a polarization calculation unit that calculates a negative electrode polarization and a positive electrode polarization from the negative electrode resistance and the positive electrode resistance acquired by the electrode resistance acquisition unit and the electrical current value flowing through the secondary battery acquired by the electrical current value acquisition unit;
a CCP calculation unit that calculates a closed-circuit potential of the negative electrode based on the open circuit potential of the negative electrode acquired by the OCP acquisition unit and the negative electrode polarization calculated by the polarization calculation unit, and calculates a closed-circuit potential of the positive electrode based on the open circuit potential of the positive electrode acquired by the OCP acquisition unit and the positive electrode polarization calculated by the polarization calculation unit;

a capacity prediction unit that predicts a negative electrode capacity, a positive electrode capacity, and a positive/negative electrode SOC capacity deviation of the secondary battery based on at least one of the closed-circuit potential of the negative electrode and the closed-circuit potential of the positive electrode calculated by the CCP calculation unit, and predicts a battery capacity of the secondary battery based on the predicted negative electrode capacity, the positive electrode capacity, and the positive/negative electrode SOC capacity deviation; and a display configured to display the predicted battery capacity of the secondary battery.

2. The battery deterioration prediction system according to claim 1, wherein the electrode resistance acquisition unit and the capacity prediction unit use a plurality of functions having correlations with a plurality of deterioration factors in the negative electrode of the secondary battery to calculate both the negative electrode resistance and the negative electrode capacity, and use a plurality of functions having correlations with a plurality of deterioration factors in the positive electrode of the secondary battery to calculate both the positive electrode resistance and the positive electrode capacity; and the capacity prediction unit uses a plurality of functions having correlations with a plurality of deterioration factors in an electrolyte of the secondary battery to calculate the positive/negative electrode SOC capacity deviation.

3. The battery deterioration prediction system according to claim 2 further comprising:

an estimation unit that estimates data that could not be acquired during a data non-acquisition period during which data required to acquire values of variables included in the plurality of functions could not be acquired; wherein the electrode resistance acquisition unit and the capacity prediction unit use the values of the variables acquired based on the data estimated by the estimation unit to calculate the negative electrode resistance, the negative electrode capacity, the positive electrode resistance, the positive electrode capacity, and the positive/negative electrode SOC capacity deviation in the data non-acquisition period.

4. The battery deterioration prediction system according to claim 1, further comprising:

a change amount calculation unit that calculates a change amount of a charging rate of the secondary battery based on the electrical current value flowing through the secondary battery acquired by the electrical current value acquisition unit; wherein the electrode resistance acquisition unit and the capacity prediction unit, using an elapsed time t from a start of use of the secondary battery and a change amount ΔDOD of the charging rate of the secondary battery acquired by the change amount calculation unit as variables, predict at least one of the negative electrode capacity, the positive electrode capacity, the positive/negative electrode SOC capacity deviation, the negative electrode resistance and the positive electrode resistance based on a pulverization function f (t, ΔDOD)=A×exp {−B×exp (C×ΔDOD)×t}, where A, B, and C are constants.

5. The battery deterioration prediction system according to claim 4, further comprising:

a learning unit that updates the constants A, B and C of the pulverization function by learning.

6. The battery deterioration prediction system according to claim 1, further comprising:

a learning unit that updates a prediction equation for calculating or predicting at least one of the negative electrode resistance, the positive electrode resistance, the negative electrode capacity, the positive electrode capacity, the positive/negative electrode SOC capacity deviation of the secondary battery, and the battery capacity of the secondary battery.

7. The battery deterioration prediction system according to claim 5, wherein the learning unit performs the learning using a usage history of the secondary battery.

8. The battery deterioration prediction system according to claim 5, wherein at least a part other than the learning unit is mounted in a vehicle and used, and the learning unit is provided outside the vehicle.

9. The battery deterioration prediction system according to claim 1, further comprising:

a storage unit that stores an initial OCP characteristic that is a relation between a charging rate and the open circuit potential of the negative electrode and a relation between a charging rate and the open circuit potential of the positive electrode of the secondary battery in an initial state;

an OCV characteristic calculation unit that calculates an update OCV characteristic that is a relation between the charging rate and an open circuit voltage of the secondary battery based on the negative electrode capacity, the positive electrode capacity, and the positive/negative electrode SOC capacity deviation predicted by the capacity prediction unit, and the initial OCP characteristic stored in the storage unit;

a differential characteristic calculation unit that, based on the updated OCV characteristic calculated by the OCV characteristic calculation unit, calculates a differential characteristic that is a relation between the charging rate of the secondary battery and a differential value obtained by first-order or second-order differentiation of the open circuit voltage of the secondary battery with the charging rate of the secondary battery; and an electrical current control unit that, based on the differential characteristic calculated by the differential characteristic calculation unit, limits current flowing in the secondary battery in a region of the charging rate where a peak of the differential value is equal to or greater than a threshold value.

10. The battery deterioration prediction system according to claim 1, further comprising:

a mechanical change calculation unit that, based on the positive/negative electrode SOC capacity deviation that is predicted by the capacity prediction unit, calculates a relational value for mechanical change of the secondary battery.

11. The battery deterioration prediction system according to claim 1, wherein the secondary battery is mounted in a vehicle; and
at least a part of the battery deterioration prediction system is mounted outside the vehicle.

12. A battery deterioration prediction system comprising:
a temperature sensor configured to measure a temperature of a secondary battery;

an electrical current sensor configured to measure an electrical current flowing through the secondary battery;

a battery management system comprising circuitry that is configured to:
- acquire a negative electrode resistance and a positive electrode resistance of the secondary battery, based on at least output from the temperature sensor,
- acquire an electrical current value of the secondary battery, based on output from the electrical current sensor,
- acquire an open circuit potential of the negative electrode of the secondary battery and an open circuit potential of the positive electrode of the secondary battery,
- calculate a negative electrode polarization and a positive electrode polarization from the negative electrode resistance and the positive electrode resistance acquired by the battery management system and the electrical current value flowing through the secondary battery acquired by the battery management system,
- calculate a closed-circuit potential of the negative electrode based on the open circuit potential of the negative electrode acquired by the battery management system and the negative electrode polarization calculated by the battery management system, and calculate a closed-circuit potential of the positive electrode based on the open circuit potential of the positive electrode acquired by the battery management system and the positive electrode polarization calculated by the battery management system, and
- predict a negative electrode capacity, a positive electrode capacity, and a positive/negative electrode SOC capacity deviation of the secondary battery based on at least one of the closed-circuit potential of the negative electrode and the closed-circuit potential of the positive electrode calculated by the battery management system, and predict a battery capacity of the secondary battery based on the predicted negative electrode capacity, the positive electrode capacity, and the positive/negative electrode SOC capacity deviation; and a display configured to display the predicted battery capacity of the secondary battery.

* * * * *